US012666766B2

(12) United States Patent
Cho et al.

(10) Patent No.: US 12,666,766 B2
(45) Date of Patent: Jun. 23, 2026

(54) DISPLAY DEVICE CAPABLE OF ADJUSTING A VIEWING ANGLE AND METHOD OF MANUFACTURING THE SAME

(71) Applicant: Samsung Display Co., Ltd., Yongin-Si (KR)

(72) Inventors: Hyunmin Cho, Hwaseong-si (KR); Dawoon Jung, Hwaseong-si (KR); Yu-Gwang Jeong, Anyang-si (KR); Kabjong Seo, Hwaseong-si (KR); Yunjong Yeo, Hwaseong-si (KR); Jaehun Lee, Seongnam-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 356 days.

(21) Appl. No.: 18/226,793

(22) Filed: Jul. 27, 2023

(65) Prior Publication Data

US 2024/0047619 A1 Feb. 8, 2024

(30) Foreign Application Priority Data

Aug. 2, 2022 (KR) ........................ 10-2022-0096242

(51) Int. Cl.
  *H10H 20/84* (2025.01)
  *H10W 90/00* (2026.01)
  *H10H 20/01* (2025.01)
(52) U.S. Cl.
  CPC ............ *H10H 20/84* (2025.01); *H10W 90/00* (2026.01); *H10H 20/034* (2025.01)

(58) Field of Classification Search
  CPC .. H10K 59/8792; H10K 59/878; H10K 59/12; H10K 59/352; H10K 50/856; H10K 50/865; H10K 71/00; H10H 20/84; H10H 20/034; H10H 20/01; H10H 29/142; H10H 20/854; H10W 90/00
  See application file for complete search history.

(56) References Cited

U.S. PATENT DOCUMENTS

| | | | |
|---|---|---|---|
| 6,787,796 B2* | 9/2004 | Do ........................ | H10K 59/879 257/40 |
| 7,990,058 B2* | 8/2011 | Cok .................... | H10K 59/8792 313/506 |
| 8,618,730 B2* | 12/2013 | Park ...................... | H05B 33/04 313/506 |
| 9,829,614 B2 | 11/2017 | Smith et al. | |
| 2020/0168844 A1 | 5/2020 | Kim et al. | |
| 2022/0059805 A1 | 2/2022 | Cho et al. | |
| 2022/0085335 A1 | 3/2022 | Shimatsu | |

(Continued)

FOREIGN PATENT DOCUMENTS

| | | |
|---|---|---|
| CN | 113013310 A | 6/2021 |
| JP | 1997-067984 A | 3/1997 |

(Continued)

*Primary Examiner* — Kevin Quarterman
(74) *Attorney, Agent, or Firm* — Innovation Counsel LLP

(57) ABSTRACT

A display device includes a substrate, a light emitting diode disposed on the substrate and light control patterns overlapping the light emitting diode, the light control patterns including at least three light blocking patterns and at least two organic patterns alternately disposed on the light emitting diode and spaced apart from each other.

12 Claims, 25 Drawing Sheets

(56)                        References Cited

U.S. PATENT DOCUMENTS

2022/0149108 A1      5/2022  Yoo et al.
2022/0209203 A1*     6/2022  Kim ..................... G06F 3/0446
2022/0238606 A1*     7/2022  Jeong .................... H10K 59/38

FOREIGN PATENT DOCUMENTS

JP           2013-205700  A     10/2013
KR      10-2014-0065506  A      5/2014
KR      10-2020-0063591  A      6/2020
KR      10-2021-0125480  A     10/2021
KR      10-2022-0023284  A      3/2022
KR      10-2022-0062208  A      5/2022

* cited by examiner

FIG. 2

REA2
BEA2
NEA2
GEA2

A

PX2
PX
PX1

LCP

REA1
BEA1
NEA1
GEA1

DR2
DR1

BMP:BMP1,BMP2,BMP3
OGP:OGP1,OGP2

BMP:BMP1,BMP2,BMP3
OGP:OGP1,OGP2

TDL

TFE

PDL

VIA

ILD

GI

BUF

SUB

ANO

ML

CAT

LED

DE

GAT

SE ACT

DR2

DR1

F I G. 14
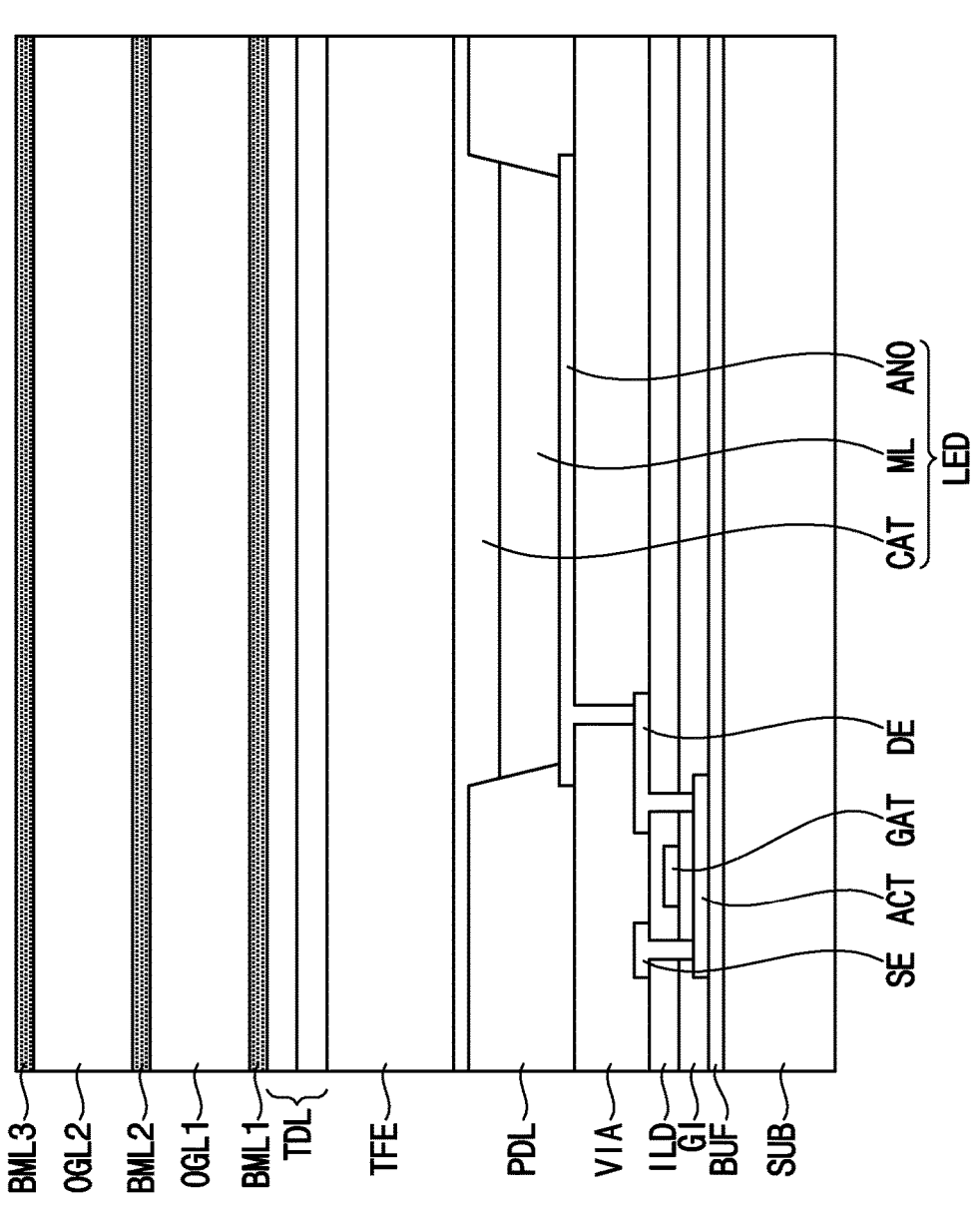
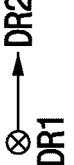
DR2
DR1

PR
BMP3
OGP2
BML2
OGL1
BML1
TDL
TFE
PDL
VIA
ILD
GI
BUF
SUB

ANO
ML
LED
CAT

DE
GAT
ACT
SE

PR
BMP3
OGP2
BMP2
OGL1
BML1
TDL
TFE
PDL
VIA
ILD
GI
BUF
SUB

ANO
ML
LED
CAT

DE
GAT
ACT
SE

PR
BMP3
OGP2
BMP2
OGP1
BML1
TDL
TFE
PDL
VIA
ILD
GI
BUF
SUB

ANO
ML
LED
CAT

DE
GAT
ACT
SE

PR
BMP3
OGP2
BMP2
OGP1
BMP1
LCP
TDL
TFE
PDL
VIA
ILD
GI
BUF
SUB

ANO
ML
LED
CAT

DE
GAT
ACT
SE

BMP3
OGP2
BMP2
OGP1
BMP1

LCP

LCL

TDL
TFE
PDL
VIA
ILD
GI
BUF
SUB

ANO
ML
CAT

LED

DE
GAT
ACT
SE

PR
BMP3
OGP2
BMP2
OGP1
BMP1
LCP"
TDL
TFE
PDL
VIA
ILD
GI
BUF
SUB

ANO
ML
LED
CAT

DE
SE ACT GAT

DR2
DR3
DR1

F I G. 27

LCL

OF

BMP3
OGP2
BMP2    LCP"
OGP1
BMP1

TDL

TFE

PDL

VIA
ILD
GI
BUF
SUB

SE  ACT  GAT  DE

CAT  ML  ANO
LED

DR3 ←⊗→ DR2
       DR1

1

DISPLAY DEVICE CAPABLE OF ADJUSTING A VIEWING ANGLE AND METHOD OF MANUFACTURING THE SAME

CROSS-REFERENCE TO RELATED APPLICATION(S)

This application claims priority under 35 USC § 119 to Korean Patent Application No. 10-2022-0096242 filed on Aug. 2, 2022, in the Korean Intellectual Property Office (KIPO), the entire disclosure of which is incorporated by reference herein.

BACKGROUND

1. Field

Embodiments relate to a display device. More particularly, embodiments relate to a display device capable of adjusting a viewing angle and a method of manufacturing the same.

2. Description of the Related Art

A display device is a device that displays an image to provide visual information to a user. Recently, as the thickness and weight of display devices decrease, the uses of display devices are diversifying.

The display device may provide different visual information according to a viewing angle. In general, a display device is manufactured to implement a wide viewing angle, but it may be necessary to temporarily implement a display device with a narrow viewing angle so that the screen of the display device is recognized only at a certain position.

SUMMARY

Embodiments provide a display device with improved reliability.

Embodiments provide a method of manufacturing the display device.

A display device according to an embodiment may include a substrate, a light emitting diode disposed on the substrate and light control patterns overlapping the light emitting diode, the light control patterns including at least three light blocking patterns and at least two organic patterns alternately disposed on the light emitting diode and spaced apart from each other.

In an embodiment, the display device may further include an organic film disposed on the light emitting diode and disposed between adjacent light control patterns.

In an embodiment, the organic film may contact the at least two organic patterns and include the same material as the at least two organic patterns.

In an embodiment, the organic film may cover upper surfaces of the light control patterns.

In an embodiment, the light blocking patterns and the at least two organic patterns included in one of the light control patterns may overlap each other.

In an embodiment, the light control pattern may include a first light blocking pattern disposed on the light emitting diode, a first organic pattern disposed on the first light blocking pattern, a second light blocking pattern disposed on the first organic pattern, a second organic pattern disposed on the second light blocking pattern and a third light blocking pattern disposed on the second organic pattern.

In an embodiment, a thickness of the first organic pattern and a thickness of the second organic pattern may be equal to each other.

In an embodiment, a thickness of the first organic pattern and a thickness of the second organic pattern may be different from each other.

In an embodiment, the light blocking patterns may include a conductive material, a black pigment, or a black dye.

In an embodiment, the light blocking patterns may include molybdenum-tantalum oxide (MTO).

In an embodiment, each of the light blocking patterns may have a multilayer structure.

In an embodiment, the multilayer structure may be at least one selected from the group consisting of MTO/Mo, MTO/Ti, MTO/Al, MTO/Mo/MTO, MTO/Ti/MTO, and MTO/Al/MTO.

A method of manufacturing a display device according to an embodiment may include forming a light emitting diode on a substrate, forming a first light blocking layer on the light emitting diode, forming a first organic layer on the first light blocking layer, forming a second light blocking layer on the first organic layer, forming a second organic layer on the second light blocking layer, forming a third light blocking layer on the second organic layer, forming a photoresist pattern on the third light blocking layer and forming light control patterns spaced apart from each other by sequentially patterning third light blocking layer, the second organic layer, the second light blocking layer, the first organic layer, and the first light blocking layer using the photoresist pattern as a mask.

In an embodiment, the forming of the light control patterns may include forming first light blocking patterns spaced apart from each other by patterning the first light blocking layer, forming first organic patterns spaced apart from each other by patterning the first organic layer, forming second light blocking patterns spaced apart from each other by patterning the second light blocking layer, forming second organic patterns spaced apart from each other by patterning the second organic layer and forming third light blocking patterns spaced apart from each other by patterning the third light blocking layer.

In an embodiment, the forming of the first to third light blocking patterns and the forming of the first and second organic patterns may be performed under different conditions from each other.

In an embodiment, the light control pattern may include the first light blocking pattern, the first organic pattern, the second light blocking pattern, the second organic pattern, and the third light blocking pattern.

In an embodiment, the method may further include forming an organic film between adjacent light control patterns on the light emitting diode after the forming of the light control patterns.

In an embodiment, the organic film may be formed of the same material as the first organic layer and the second organic layer.

In an embodiment, the forming of the light control pattern may be performed by a dry etch process.

In an embodiment, the first to third light blocking layers may include a conductive material, molybdenum-tantalum oxide, a black pigment, or a black dye.

In a display device according to embodiments of the present disclosure, as the light control layer includes light control patterns spaced apart from each other, and each of the light control patterns includes light blocking patterns and organic patterns that are alternately stacked, the size of the area through which light emitted from the light emitting diode can pass may be maintained uniform. Accordingly, reliability of the display device may be improved while maintaining a uniform transmittance of the display device.

In addition, by forming the first to third light blocking layers and the first and second organic layers on the light emitting diode and patterning them using a same photoresist pattern as a mask, a difference in a side profile of each of the first and second organic patterns may be reduced or the display device having the same structure may be formed regardless of the side profile of each of the first and second organic patterns. In addition, the size of an area through which light emitted from the light emitting diode can pass may be maintained uniform. Accordingly, process efficiency may be improved while maintaining a uniform transmittance of the display device and reliability of the display device may be improved.

BRIEF DESCRIPTION OF THE DRAWINGS

FIG. 2 is an enlarged plan view of area A of FIG. 1.

FIGS. 9, 10, 11, 12, 13, 14, 15, 16, 17, 18, 19, 20, 21, 22, 23 and 24 are cross-sectional views illustrating a method of manufacturing a display device according to an embodiment.

FIGS. 25, 26 and 27 are cross-sectional views illustrating a manufacturing method of a display device according to another embodiment.

DETAILED DESCRIPTION OF THE EMBODIMENTS

Figure 1:
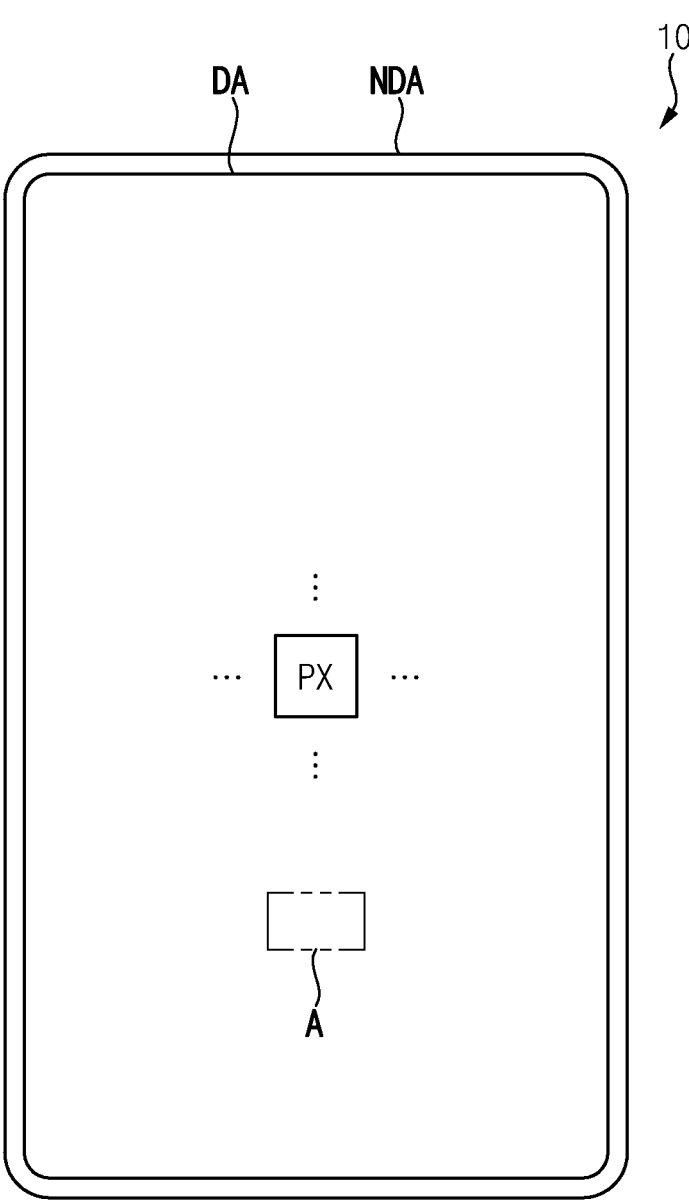
FIG. 1 is a plan view illustrating a display device according to an embodiment of the present disclosure.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device 10 may include a display area DA and a non-display area NDA. The display area DA may be an area displaying an image. A planar shape of the display area DA may be a rectangular shape or a rectangular shape with rounded corners as shown in FIG. 1. However, the planar shape of the display area DA is not limited thereto, and the display area DA may have various planar shapes such as a circular shape, an elliptical shape, and a polygonal shape.

The non-display area NDA may be disposed around the display area DA. The non-display area NDA may surround the display area DA. The non-display area NDA may be an area not displaying an image. In an embodiment, drivers for displaying an image of the display area DA may be disposed in the non-display area NDA.

Pixels PX may be arranged in a matrix configuration in the display area DA. Signal lines such as a gate line and a data line may be disposed in the display area DA. The signal lines such as the gate line and the data line may be connected to each of the pixels PX. Each of the pixels PX may receive a gate signal, a data signal, and the like from the signal lines.

Figure 2:
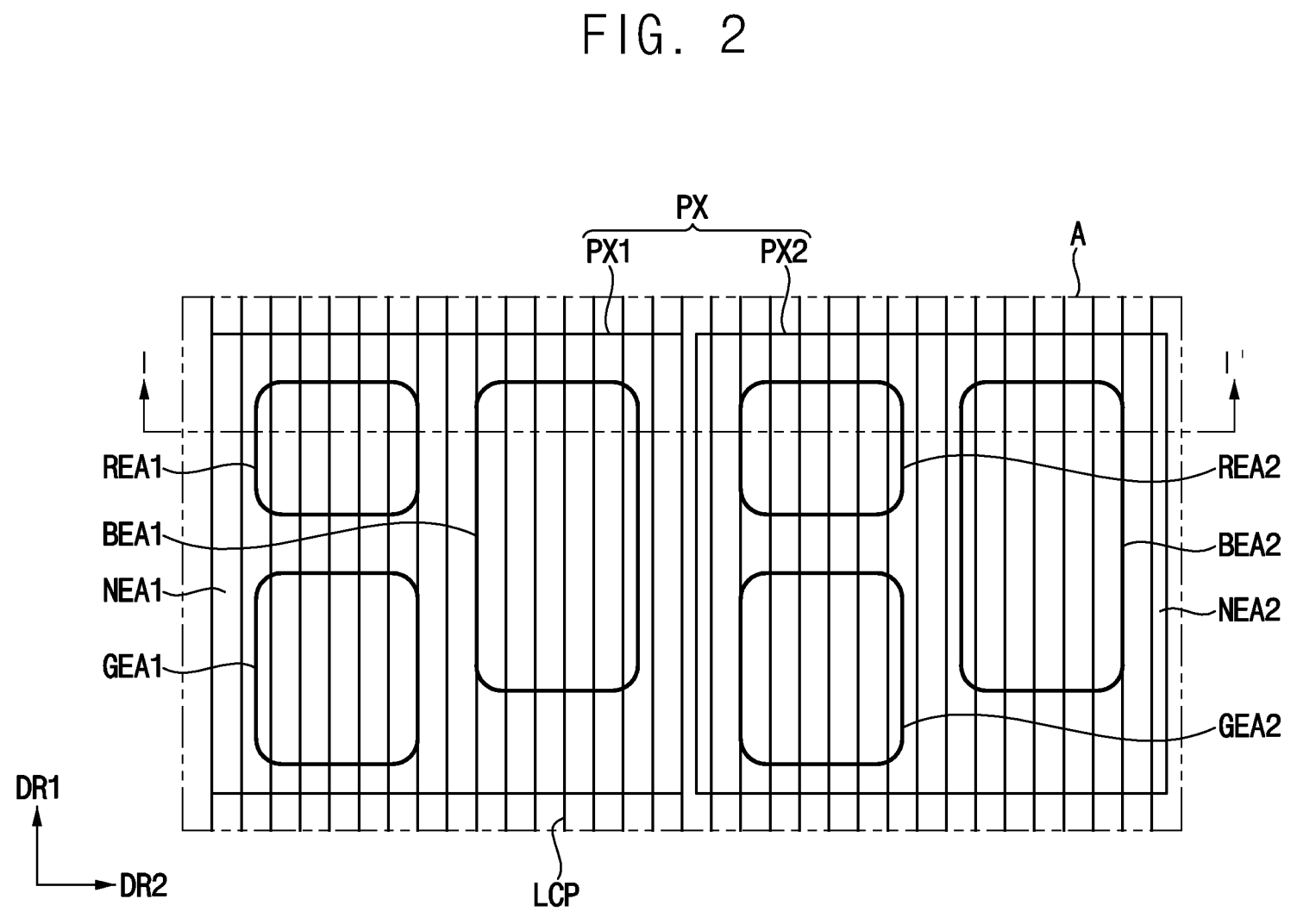

FIG. 2 is an enlarged plan view of area A of FIG. 1.

Referring to FIGS. 1 and 2, the pixel PX included in the display device 10 may include a first pixel PX1 and a second pixel PX2.

The first pixel PX1 may include a first red light emitting area REA1, a first green light emitting area GEA1, a first blue light emitting area BEA1, and a first non-light emitting area NEA1. The second pixel PX2 may include a second red light emitting area REA2, a second green light emitting area GEA2, a second blue light emitting area BEA2, and a second non-light emitting area NEA2.

The first red light emitting area REA1 and the second red light emitting area REA2 may emit red light. The first green light emitting area GEA1 and the second green light emitting area GEA2 may emit green light. The first blue light emitting area BEA1 and the second blue light emitting area BEA2 may emit blue light. The first non-emission area NEA1 and the second non-emission area NEA2 may not emit light. As the red light, the green light, and the blue light are combined, the first pixel PX1 and the second pixel PX2 may respectively emit light of various colors.

In an embodiment, the display device 10 may include a plurality of light control patterns LCP. The light control patterns LCP may be arranged side by side with each other in a plan view. The light control patterns LCP may be parallel to each other. The light control patterns LCP may extend in a first direction DR1. The light control patterns LCP may be spaced apart from each other in a second direction DR2 crossing the first direction DR1. However, the present disclosure is not limited thereto.

Figure 3:
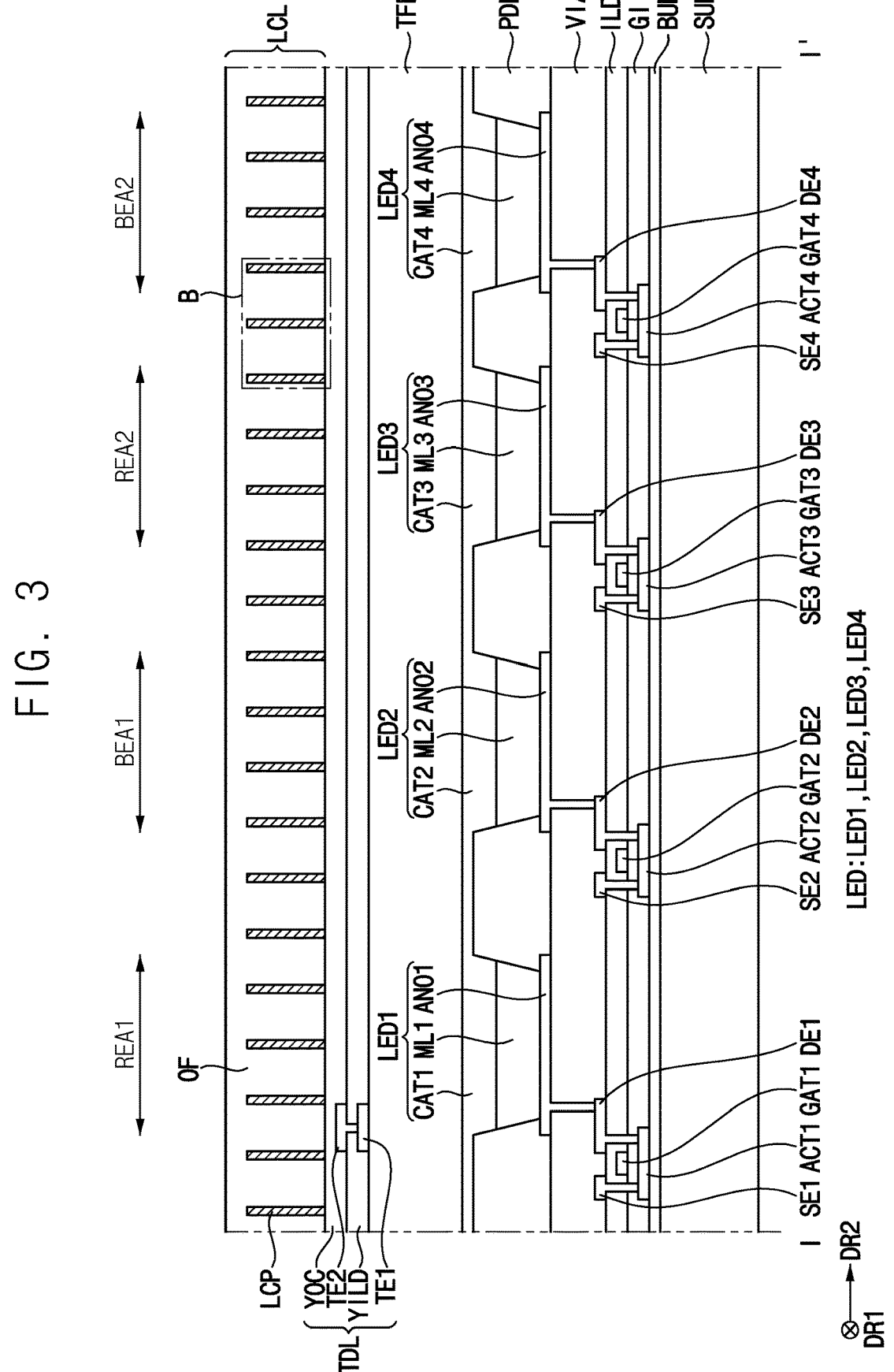
FIG. 3 is a cross-sectional view taken along line I-I' of FIG. 2.

FIG. 3 is a cross-sectional view taken along line I-I' of FIG. 2.

Referring to FIG. 3, the display device 10 may include a substrate SUB, a buffer layer BUF, first to fourth active patterns ACT1, ACT2, ACT3, and ACT4, a gate insulation layer GI, a first to fourth gate electrodes GAT1, GAT2, GAT3, and GAT4, an interlayer insulation layer ILD, first to fourth source electrodes SE1, SE2, SE3, and SE4, first to fourth drain electrodes DE1, DE2, DE3, and DE4, a via insulation layer VIA, a light emitting diode LED, a pixel defining layer PDL, an encapsulation layer TFE, a touch sensing layer TDL, and a light control layer LCL.

The substrate SUB may be a flexible substrate made of polyimide or the like. The flexible substrate may have a structure in which polyimide layers and barrier layers are alternately stacked. For another example, the substrate SUB may be a rigid substrate made of quartz, glass, or the like.

The buffer layer BUF may be disposed on the substrate SUB. The buffer layer BUF may prevent diffusion of metal atoms or impurities from the substrate SUB into the first to fourth active patterns ACT1, ACT2, ACT3, and ACT4. The buffer layer BUF may control a heat supply rate during a crystallization process of forming the first to fourth active patterns ACT1, ACT2, ACT3, and ACT4. The buffer layer BUF may include an inorganic insulating material. Examples of the inorganic insulating material may include silicon oxide, silicon nitride, and silicon oxynitride. These may be used alone or in combination with each other.

The first active pattern ACT1 may be disposed on the buffer layer BUF. The first active pattern ACT1 may include a silicon semiconductor or an oxide semiconductor. Examples of the silicon semiconductor may include amorphous silicon and polycrystalline silicon. The second to fourth active patterns ACT2, ACT3, and ACT4 may be formed together with the first active pattern ACT1 and may include substantially the same material.

The gate insulation layer GI may be disposed on the first to fourth active patterns ACT1, ACT2, ACT3, and ACT4, and may cover the first to fourth active patterns ACT1, ACT2, ACT3, and ACT4. The gate insulation layer GI may include an inorganic insulating material.

The first gate electrode GAT1 may be disposed on the gate insulation layer GI. The first gate electrode GAT1 may overlap the first active pattern ACT1. The first gate electrode GAT1 may include metal, metal oxide, metal nitride, or the like. Examples of the metal include silver, molybdenum, aluminum, tungsten, copper, nickel, chromium, titanium, tantalum, platinum, and scandium. These may be used alone or in combination with each other. Examples of the metal oxide include indium tin oxide (ITO) and indium zinc oxide (IZO). These may be used alone or in combination with each other. Examples of the metal nitride include aluminum nitride, tungsten nitride, and chromium nitride. These may be used alone or in combination with each other. The second gate electrode GAT2 may overlap the second active pattern ACT2. The third gate electrode GAT3 may overlap the third active pattern ACT3. The fourth gate electrode GAT4 may overlap the fourth active pattern ACT4. The second to fourth gate electrodes GAT2, GAT3, and GAT4 may be formed together with the first gate electrode GAT1 and may include substantially the same material.

The interlayer insulation layer ILD may be disposed on the first to fourth gate electrodes GAT1, GAT2, GAT3, and GAT4, and cover the first to fourth gate electrodes GAT1, GAT2, GAT3, and GAT4. The interlayer insulation layer ILD may include an inorganic insulating material.

The first source electrode SE1 and the first drain electrode DE1 may be disposed on the interlayer insulation layer ILD. Each of the first source electrode SE1 and the first drain electrode DE1 may be connected to the first active pattern ACT1 through a contact hole. Each of the first source electrode SE1 and the first drain electrode DE1 may include a metal, a metal oxide, a metal nitride, or the like. Each of the second source electrode SE2 and the second drain electrode DE2 may be connected to the second active pattern ACT2 through a contact hole. Each of the third source electrode SE3 and the third drain electrode DE3 may be connected to the third active pattern ACT3 through a contact hole. Each of the fourth source electrode SE4 and the fourth drain electrode DE4 may be connected to the fourth active pattern ACT4 through a contact hole. The second to fourth source electrodes SE2, SE3, SE4 and the second to fourth drain electrodes DE2, DE3, DE4 may be formed together with the first source electrode SE1 and the first drain electrode DE1 and may include substantially the same material.

The via insulation layer VIA may be disposed on the first to fourth source electrodes SE1, SE2, SE3, and SE4 and the first to fourth drain electrodes DE1, DE2, DE3, and DE4. The via insulation layer VIA may cover the first to fourth source electrodes SE1, SE2, SE3, and SE4 and the first to fourth drain electrodes DE1, DE2, DE3, and DE4. The via insulation layer VIA may have a substantially flat top surface. The via insulation layer VIA may include an organic insulating material. Examples of the organic insulating material include photoresist, polyacrylic resin, polyimide resin, and the like. These may be used alone or in combination with each other.

The light emitting diode LED may include the first to fourth light emitting diodes LED1, LED2, LED3, and LED4. The light emitting diode LED may be disposed on the via insulation layer VIA. The first light emitting diode LED1 may include a first red pixel electrode ANO1, a first intermediate layer ML1, and a first common electrode CAT1. The second light emitting diode LED2 may include a first blue pixel electrode ANO2, a second intermediate layer ML2, and a second common electrode CAT2. The third light emitting diode LED3 may include a second red pixel electrode ANO3, a third intermediate layer ML3, and a third common electrode CAT3. The fourth light emitting diode LED4 may include a second blue pixel electrode ANO4, a fourth intermediate layer ML4, and a fourth common electrode CAT1.

The first red pixel electrode ANO1 may overlap the first red light emitting area REA1. The first red pixel electrode ANO1 may be connected to the first drain electrode DE1 through a contact hole. The first red pixel electrode ANO1 may include metal, metal oxide, metal nitride, or the like.

The first blue pixel electrode ANO2 may overlap the first blue light emitting area BEA1. The first blue pixel electrode ANO2 may be connected to the second drain electrode DE2 through a contact hole.

The second red pixel electrode ANO3 may overlap the second red light emitting area REA2. The second red pixel electrode ANO3 may be connected to the third drain electrode DE3 through a contact hole.

The second blue pixel electrode ANO4 may overlap the second blue light emitting area BEA2. The second blue pixel electrode ANO4 may be connected to the fourth drain electrode DE4 through a contact hole.

The first red pixel electrode ANO1, the first blue pixel electrode ANO2, the second red pixel electrode ANO3, and the second blue pixel electrode ANO4 may be formed together and have substantially the same material. For example, the first red pixel electrode ANO1, the first blue pixel electrode ANO2, the second red pixel electrode ANO3, and the second blue pixel electrode ANO4 may include a reflective conductive material.

The pixel defining layer PDL may be disposed on the via insulation layer VIA. The pixel defining layer PDL may expose the first and second red pixel electrodes ANO1 and ANO3 and the first and second blue pixel electrodes ANO2 and ANO4 through respective pixel openings. The pixel defining layer PDL may cover edge portions of each of the first and second red pixel electrodes ANO1 and ANO3 and the first and second blue pixel electrodes ANO2 and ANO4. The pixel defining layer PDL may include an organic insulating material.

The first intermediate layer ML1 may be disposed on the first red pixel electrode ANO1. The second intermediate layer ML2 may be disposed on the first blue pixel electrode ANO2. The third intermediate layer ML3 may be disposed on the second red pixel electrode ANO3. The fourth intermediate layer ML4 may be disposed on the second blue pixel electrode ANO4. Each of the first to fourth intermediate layers ML1, ML2, ML3, and ML4 may include an organic material emitting light of a predetermined color. For example, the first intermediate layer ML1 and the third intermediate layer ML3 may include a first organic material emitting red light, and the second intermediate layer ML2 and the fourth intermediate layer ML4 may include a second organic material emitting blue light.

The common electrode may include a first common electrode CAT1, a second common electrode CAT2, a third common electrode CAT3, and a fourth common electrode CAT which overlap the first intermediate layer ML1, the second intermediate layer ML2, the third intermediate layer ML3, and the fourth intermediate layer ML4, respectively. The first common electrode CAT1 may be disposed on the first intermediate layer ML1. The second common electrode CAT2 may be disposed on the second intermediate layer ML2. The third common electrode CAT3 may be disposed on the third intermediate layer ML3. The fourth common electrode CAT4 may be disposed on the fourth intermediate layer ML4. The first to fourth common electrodes CAT1, CAT2, CAT3, and CAT4 may cover the pixel defining layer PDL. The first to fourth common electrodes CAT1, CAT2, CAT3, and CAT4 may be integrally formed. For example, the first to fourth common electrodes CAT1, CAT2, CAT3, and CAT4 may include a transparent conductive material.

The encapsulation layer TFE may be disposed on the light emitting diode LED. The encapsulation layer TFE may protect the light emitting diode LED from external moisture, heat, or impact. The encapsulation layer TFE may include a first inorganic encapsulation layer, an organic encapsulation layer disposed on the first inorganic encapsulation layer, and a second inorganic encapsulation layer disposed on the organic encapsulation layer.

The touch sensing layer TDL may be disposed on the encapsulation layer TFE. The touch sensing layer TDL may include a first touch electrode TE1, a touch insulation layer YILD disposed on the first touch electrode TE1, a second touch electrode TE2 disposed on the touch insulation layer YILD, and a planarization layer YOC disposed on the second touch electrode TE2. The planarization layer YOC may have a substantially flat top surface. The planarization layer YOC may be substantially parallel to a top surface of the light emitting diode LED. The second touch electrode TE2 may be connected to the first touch electrode TE1 through a contact hole. The touch sensing layer TDL may function as an input unit of the display device 10.

Figure 4:
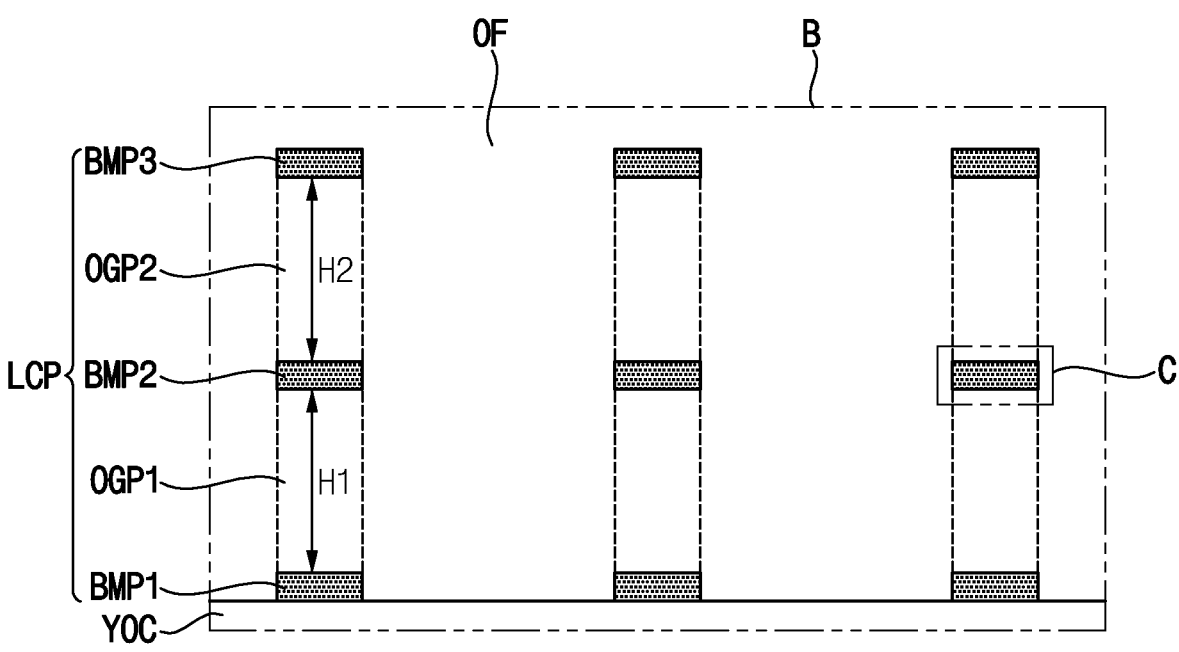
FIG. 4 is an enlarged cross-sectional view of area B of FIG. 3.

FIG. 4 is an enlarged cross-sectional view of area B of FIG. 3.

Referring to FIG. 4, in an embodiment, the light control layer LCL may be disposed on the planarization layer YOC. The light control layer LCL may include light control patterns LCP and an organic film OF. The light control patterns LCP may be spaced apart from each other. The light control patterns LCP may overlap the first to fourth light emitting diodes LED1, LED2, LED3, and LED4.

Each of the light control patterns LCP may include light blocking patterns BMP and organic patterns OGP. One light control pattern LCP may include at least three light blocking patterns BMP and at least two organic patterns OGP. The at least three light blocking patterns BMP and the at least two organic patterns OGP may be alternately stacked. The light blocking patterns BMP and the organic patterns OGP included in one of the light control pattern LCP may overlap each other.

The organic film OF may fill spaces disposed between light control patterns LCP. The organic film OF may cover the light control patterns LCP. The organic film OF may have a substantially flat top surface.

Light emitted from the light emitting diode LED may be incident on the light control patterns LCP or may pass between the light control patterns LCP. Light incident on the light control patterns LCP may be reflected by the light control patterns LCP or absorbed by the light control patterns LCP.

For example, the light control pattern LCP may include a first light blocking pattern BMP1, a first organic pattern OGP1, a second light blocking pattern BMP2, a second organic pattern OGP2, and a third light blocking pattern BMP3. The first light blocking pattern BMP1 may be disposed on the planarization layer YOC, the first organic pattern OGP1 may be disposed on the first light blocking pattern BMP1, the second light blocking pattern BMP2 may be disposed on the first organic pattern OGP1, the second organic pattern OGP2 may be disposed on the second light blocking pattern BMP2, and the third light blocking pattern BMP3 may be disposed on the second organic pattern OGP2. However, embodiments according to the present disclosure are not limited thereto, and the light control pattern LCP may have a structure in which four or more light blocking patterns BMP and three or more organic patterns OGP are alternately stacked.

Also, the first to third light blocking patterns BMP1, BMP2, and BMP3 and the first and second organic patterns OGP1 and OGP2 included in one of the light control pattern LCP may overlap each other. A side wall formed by the first to third light blocking patterns BMP1, BMP2, and BMP3 and the first and second organic patterns OGP1 and OGP2 may be disposed on a line extending perpendicular to the surface of the planarization layer YOC as shown in FIG. 4. However, the side wall formed by the first to third light blocking patterns BMP1, BMP2, and BMP3 and the first and second organic patterns OGP1 and OGP2 may have recessed portions and protruded portions alternatingly disposed.

In an embodiment, a thickness of each of the first to third light blocking patterns BMP1, BMP2, and BMP3 may be greater than or equal to about 500 angstroms (Å) and less than or equal to about 1 micrometer. When the thickness of each of the first to third light-blocking patterns BMP1, BMP2, and BMP3 is less than about 500 angstroms, light emitted from the light emitting diode LED may not be effectively blocked. Therefore, it may not be easy to adjust the viewing angle of the display device 10. In addition, when the thickness of each of the first to third light blocking patterns BMP1, BMP2, and BMP3 is greater than about 1 micrometer, the manufacturing time of the first to third light blocking patterns BMP1, BMP2, and BMP3 may increase. As a result, process efficiency may decrease. In addition, when the thickness of each of the first to third light blocking patterns BMP1, BMP2, and BMP3 is greater than about 1 micrometer, a defect may occur because an oxide film is formed on an interface between an organic pattern and a light blocking pattern disposed adjacent to each other.

For example, each of the thickness H1 of the first organic pattern OGP1 and the thickness H2 of the second organic pattern OGP2 may be greater than or equal to about 5 micrometers and less than or equal to about 50 micrometers. When each of the thickness H1 of the first organic pattern OGP1 and the thickness H2 of the second organic pattern OGP2 is less than about 5 micrometers, the thickness of the light control layer LCL becomes too small, so that the viewing angle of the display device 10 may not be easily adjusted. In addition, when each of the thickness H1 of the first organic pattern OGP1 and the thickness H2 of the second organic pattern OGP2 is greater than about 50 micrometers, light leakage may easily occur through the light control pattern LCP.

In an embodiment, the thickness H1 of the first organic pattern OGP1 and the thickness H2 of the second organic pattern OGP2 may be equal to each other.

In an embodiment, the first to third light blocking patterns BMP1, BMP2, and BMP3 may include a conductive material, black pigment, or black dye. The conductive material may have a high light reflectance. Examples of the conductive material include metal. Examples of the metal include molybdenum (Mo), aluminum (Al), titanium (Ti), tungsten (W), silver (Ag), copper (Cu), gold (Au), and the like. In addition, the black pigment or black dye may have a high light absorption rate.

In another embodiment, the first to third light blocking patterns BMP1, BMP2, and BMP3 may include molybdenum-tantalum oxide (MTO). Each of the first to third light-blocking patterns BMP1, BMP2, and BMP3 may have a single-layer structure or a multilayer structure.

Since the first to third blocking patterns BMP1, BMP2, and BMP3 include molybdenum-tantalum oxide, the first to third blocking patterns BMP1, BMP2, and BMP3 may prevent light leakage. However, the present disclosure is not limited thereto. For example, the first to third light blocking patterns BMP1, BMP2, and BMP3 may include various materials having relatively low transmittance and reflectance and relatively high absorbance.

In an embodiment, the organic film OF may include the same material as the organic patterns OGP. Also, the organic film OF may contact the first and second organic patterns OGP1 and OGP2. Accordingly, the organic film OF may contact the first and second organic patterns OGP1 and OGP2 and cover side surface of each of the first and second organic patterns OGP1 and OGP2.

In an embodiment, as the light control layer LCL includes the light control patterns LCP spaced apart from each other, and each of the light control patterns includes the light blocking patterns BMP and the organic patterns OGP alternately stacked, the size of an area through which light emitted from the light emitting diode LED can pass may be maintained constant. Accordingly, reliability of the display device 10 may be improved while maintaining an uniform transmittance of the display device 10.

In an embodiment, as each of the light control patterns LCP includes three or more light blocking patterns BMP and two or more organic patterns OGP alternately stacked, an uniform transmittance of the display device 10 may be maintained while blocking the viewing angle.

Figure 5:
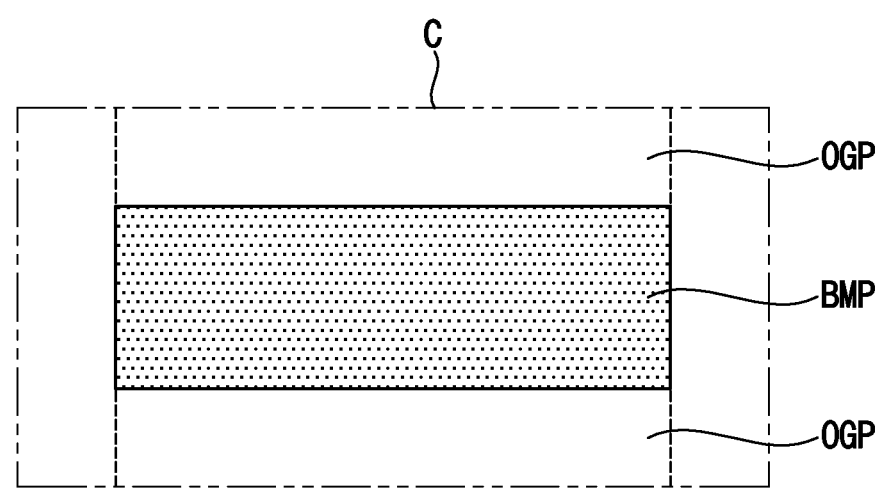
FIG. 5 is an enlarged cross-sectional view of area C of FIG. 4.

FIG. 5 is an enlarged cross-sectional view of area C of FIG. 4.

Further referring to FIG. 5, each of the light blocking patterns BMP may have a single layer structure. Each of the light blocking patterns BMP may include at least one of molybdenum (Mo), aluminum (Al), titanium (Ti), tungsten (W), silver (Ag), copper (Cu), gold (Au), black pigment, black dye, and molybdenum-tantalum oxide.

Figure 6:
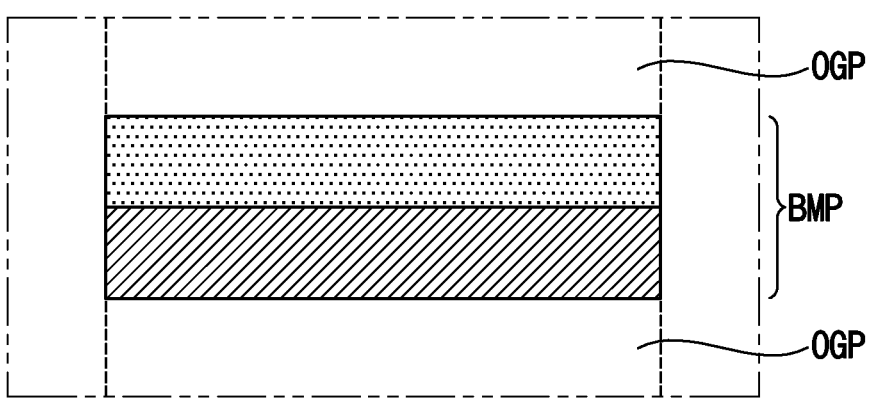
FIG. 6 is a cross-sectional view illustrating another example of the area C of FIG. 4.

FIG. 6 is a cross-sectional view illustrating another example of the area C of FIG. 4.

Referring to FIG. 6, each of the light blocking patterns BMP may have a multilayer structure. For example, each of the light-blocking patterns BMP may have a double layer structure of at least one selected from the group consisting of MTO/Mo, MTO/Cu, and MTO/Al. However, the present disclosure is not limited thereto.

Figure 7:
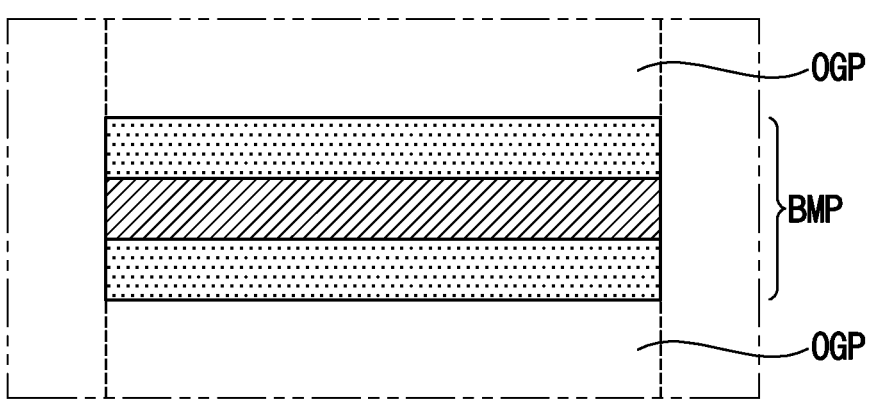
FIG. 7 is a cross-sectional view illustrating another example of the area C of FIG. 4. 5.

FIG. 7 is a cross-sectional view illustrating another example of the area C of FIG. 4.

Referring to FIG. 7, each of the light blocking patterns BMP may have a multilayer structure. For example, each of the light blocking patterns BMP may have a triple layer structure of at least one selected from the group consisting of MTO/Mo/MTO, MTO/Cu/MTO, and MTO/Al/MTO. However, the present disclosure is not limited thereto.

Figure 8:
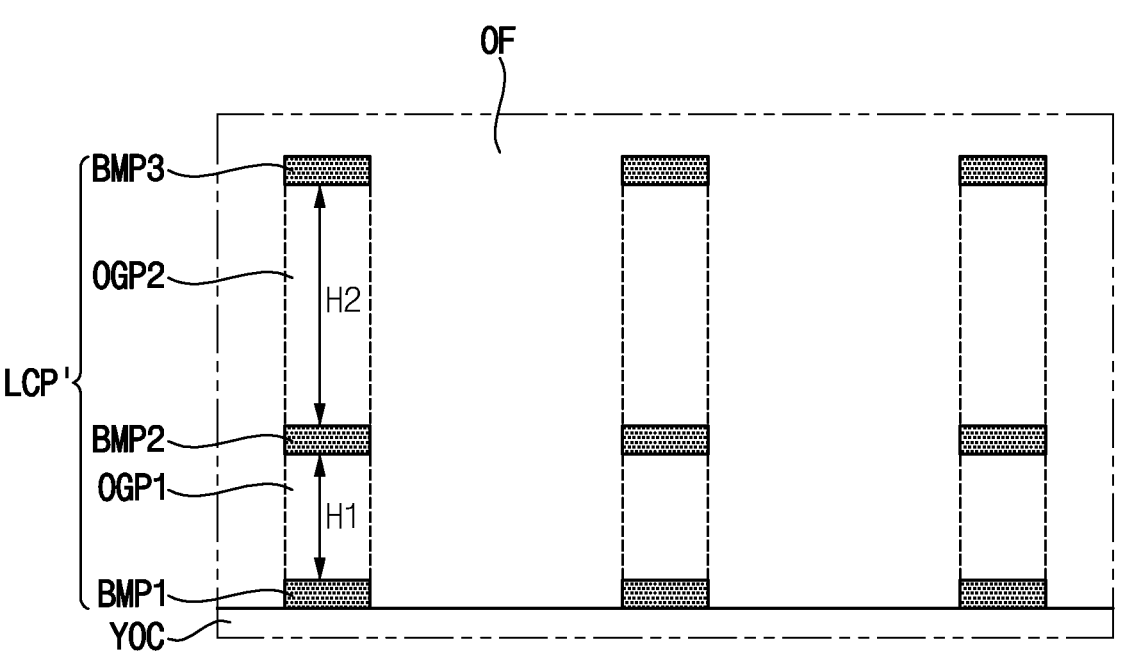
FIG. 8 is a cross-sectional view illustrating another example of the area B of FIG. 3.

FIG. 8 is a cross-sectional view illustrating another example of the area B of FIG. 3.

A light control pattern LCP' described with reference to FIG. 8 may have the same or similar structures to the light control pattern LCP described with reference to FIG. 4 other than the thickness H1 of the first organic pattern OGP1 and the thicknesses H2 of the second organic pattern OGP2. Therefore, redundant descriptions may be omitted.

Referring to FIG. 8, each of the light control patterns LCP' may include first to third light blocking patterns BMP1, BMP2, and BMP3 and first and second organic patterns OGP1 and OGP2.

In an embodiment, the thickness H1 of the first organic pattern OGP1 and the thickness H2 of the second organic pattern OGP2 may be different from each other. As the thickness H1 of the first organic pattern OGP1 and the thickness H2 of the second organic pattern OGP2 are different from each other, the light control layer LCL may block the light emitted from the light emitting diode LED more effectively.

FIGS. 9 to 24 are cross-sectional views illustrating a method of manufacturing a display device according to an embodiment.

For example, a method of manufacturing a display device described with reference to FIGS. 9 to 24 may be a method of manufacturing the display device 10 described with reference to FIGS. 1 to 4. Therefore, redundant descriptions may be omitted.

Figure 9:
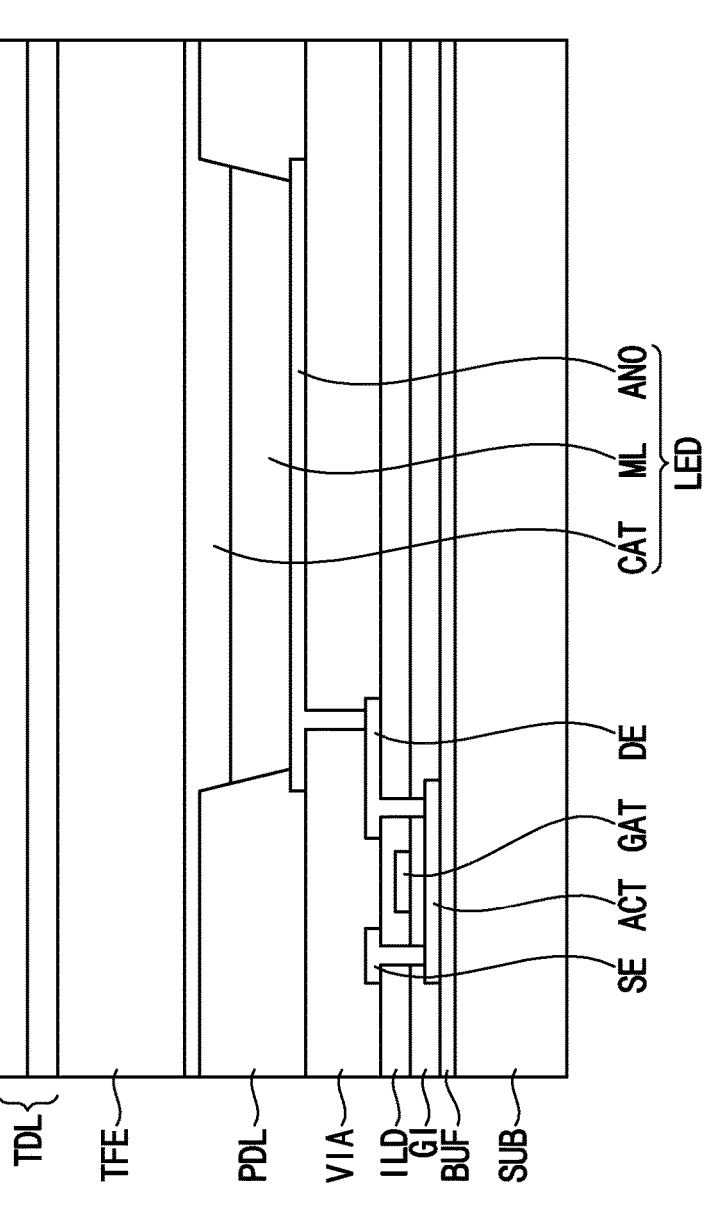
Figure 9:
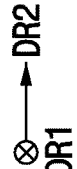

Referring to FIG. 9, a buffer layer BUF may be formed on the substrate SUB. An active pattern ACT, a gate insulation layer GI, a gate electrode GAT, an interlayer insulation layer ILD, a source electrode SE, a drain electrode DE, and a via insulation layer VIA may be formed on the buffer layer BUF.

A pixel electrode ANO, an intermediate layer ML, and a common electrode CAT may be formed on the via insulation layer VIA. The pixel electrode ANO, the intermediate layer ML, and the common electrode CAT may form a light emitting diode LED.

An encapsulation layer TFE may be formed on the light emitting diode LED. A touch sensing layer TDL may be formed on the encapsulation layer TFE.

Figure 10:
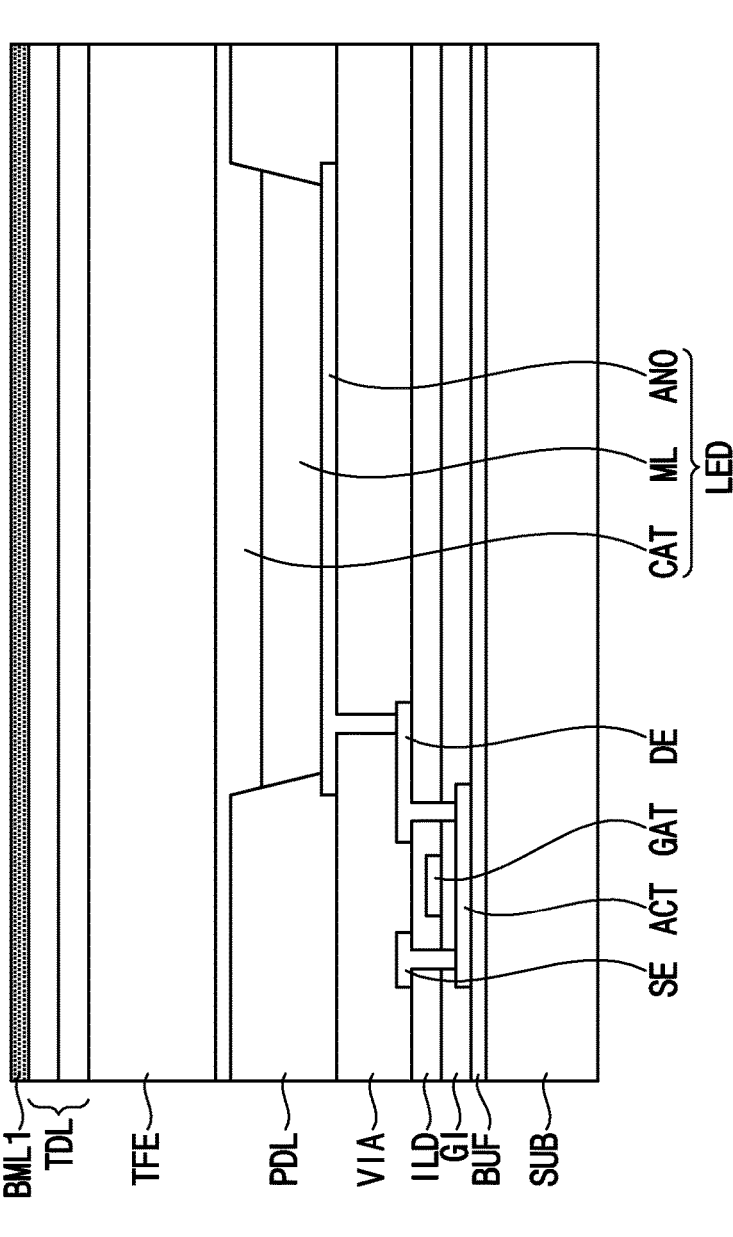

Referring to FIG. 10, a first light blocking layer BML1 may be formed on the touch sensing layer TDL. The first light blocking layer BML1 may be formed to overlap the light emitting diode LED. The first light blocking layer BML1 may be formed of a material that absorbs or reflects light. For example, the first light blocking layer BML1 may be formed of a conductive material, molybdenum-tantalum oxide, black pigment, or black dye.

Figure 11:
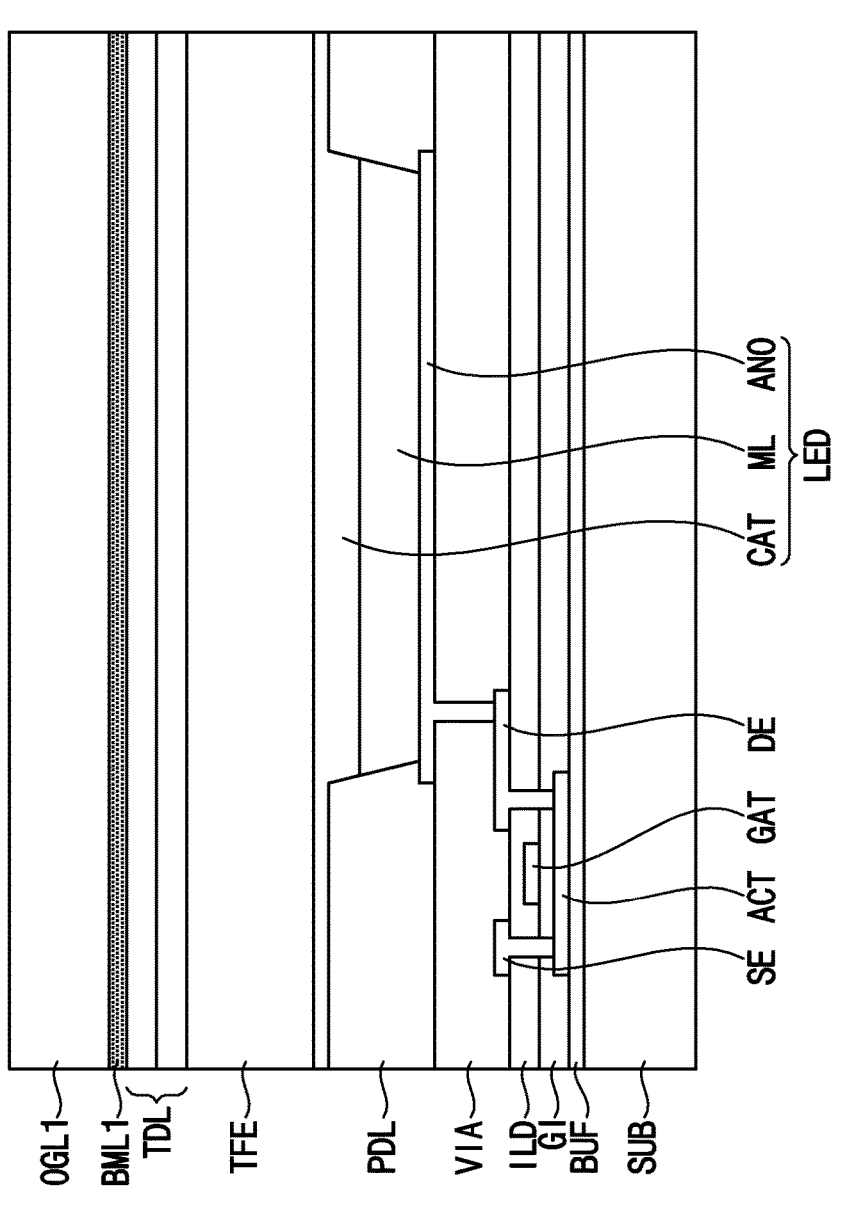

Referring to FIG. 11, a first organic layer OGL1 may be formed on the first light blocking layer BML1. The first organic layer OGL1 may be formed to overlap the first light blocking layer BML1. The first organic layer OGL1 may be formed of a transparent organic material.

Figure 12:
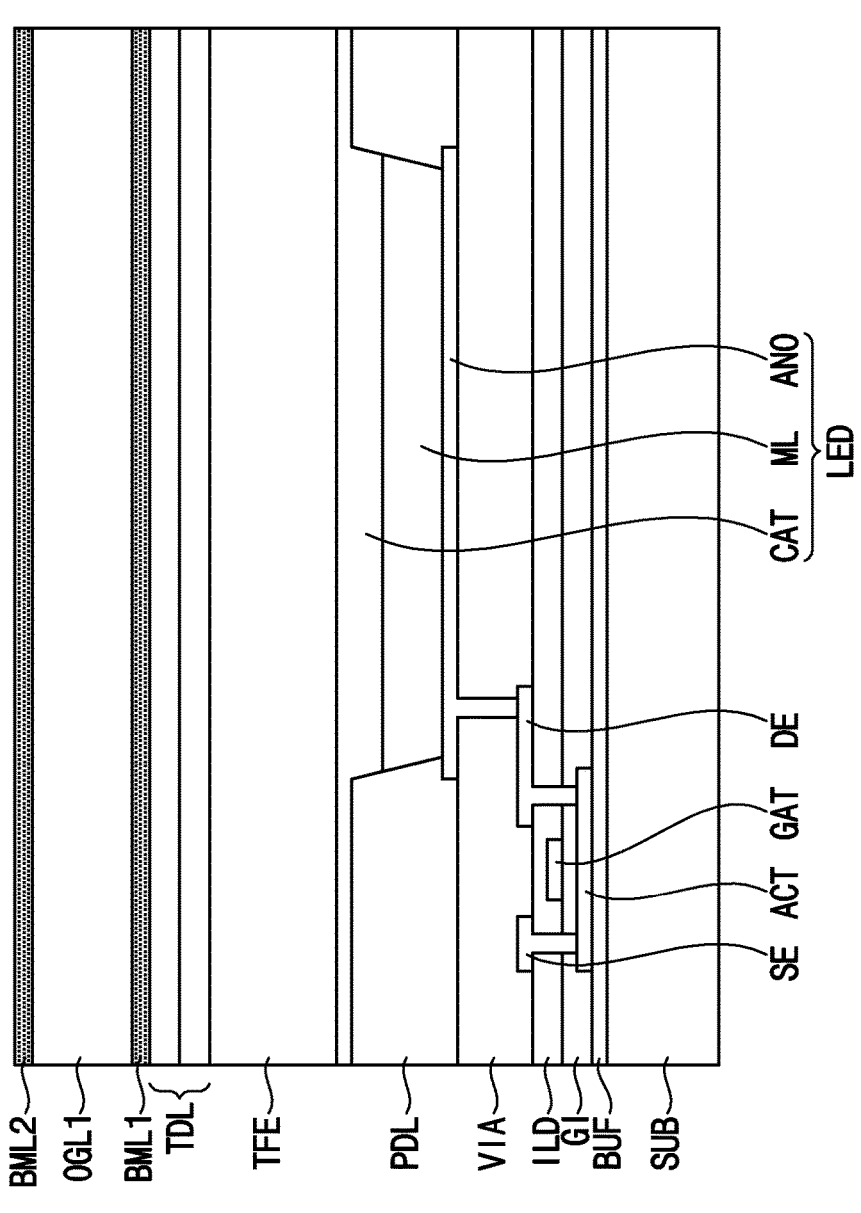

Referring to FIG. 12, a second light blocking layer BML2 may be formed on the first organic layer OGL1. The second light blocking layer BML2 may be formed to overlap the first organic layer OGL1. The second light blocking layer BML2 may be formed of a material that absorbs or reflects light. For example, the second light blocking layer BML2 may be formed of the same material as the first light blocking layer BML1.

Figure 13:
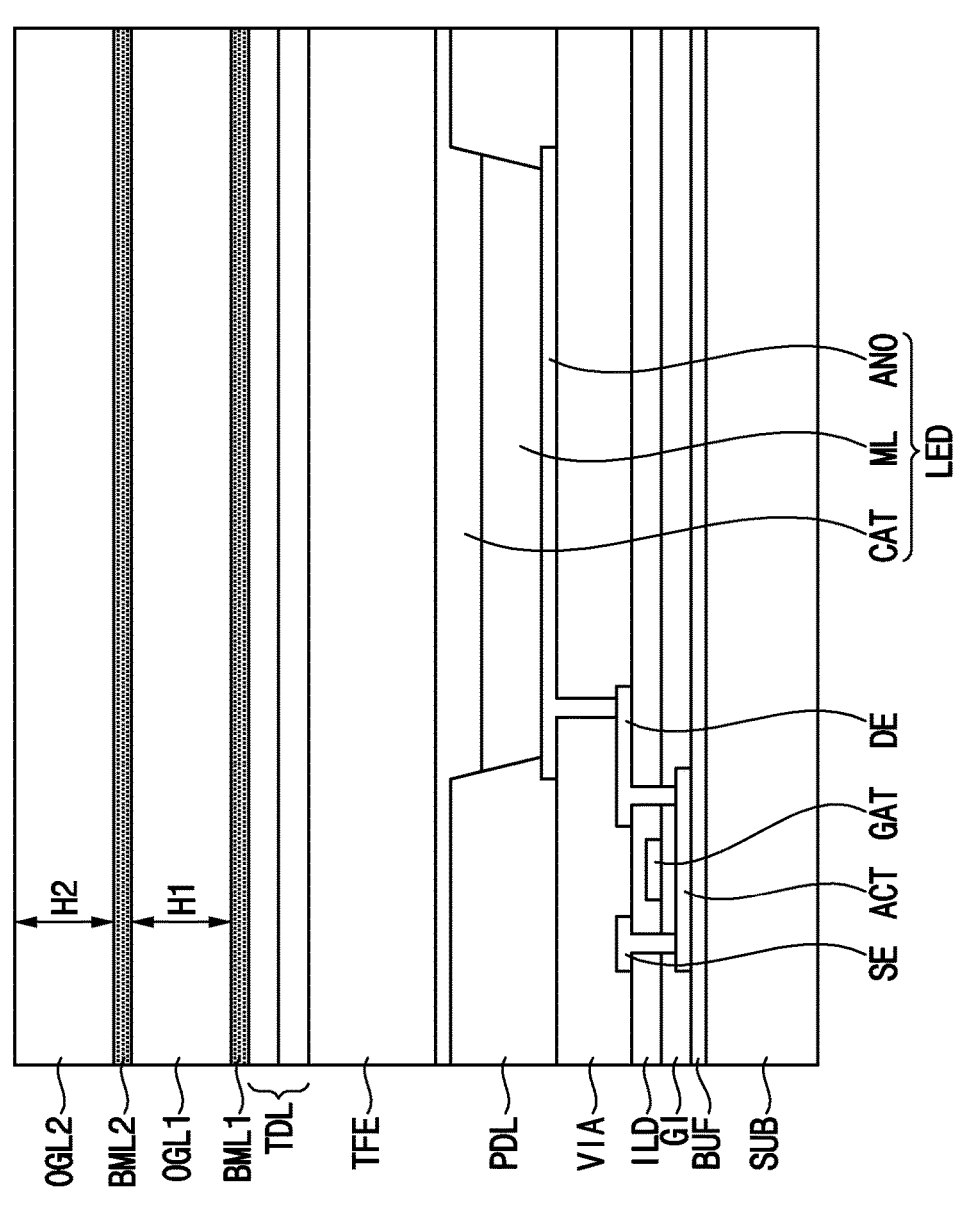

Referring to FIG. 13, a second organic layer OGL2 may be formed on the second light blocking layer BML2. The second organic layer OGL2 may be formed to overlap the second light blocking layer BML2. The second organic layer OGL2 may be formed of a transparent organic material. For example, the second organic layer OGL2 may be formed of the same material as the first organic layer OGL1.

In an embodiment, the first organic layer OGL1 and the second organic layer OGL2 may be formed to have the same thickness. That is, the thickness H1 of the first organic layer OGL1 and the thickness H2 of the second organic layer OGL2 may be equal to each other. However, the present disclosure is not limited thereto, and the first organic layer OGL1 and the second organic layer OGL2 may be formed to have different thicknesses.

Referring to FIG. 14, a third light blocking layer BML3 may be formed on the second organic layer OGL2. The third light blocking layer BML3 may be formed to overlap the second organic layer OGL2. The third light blocking layer BML3 may be formed of a material that absorbs or reflects light. For example, the third light blocking layer BML3 may be formed of the same material as the first light blocking layer BML1.

In an embodiment, each of the first to third light blocking layers BML1, BML2, and BML3 may be formed in a single-layer structure or a multi-layer structure. For example, each of the first to third light blocking layers BML1, BML2, and BML3 may be formed in a double-layer structure of at least one selected from the group consisting of MTO/Mo, MTO/Cu, and MTO/Al. Alternatively, each of the first to third light-blocking layers BML1, BML2, and BML3 may be formed in a triple layer structure of at least one selected from the group consisting of MTO/Mo/MTO, MTO/Cu/MTO, and MTO/Al/MTO. However, the present disclosure is not limited thereto.

Figure 15:
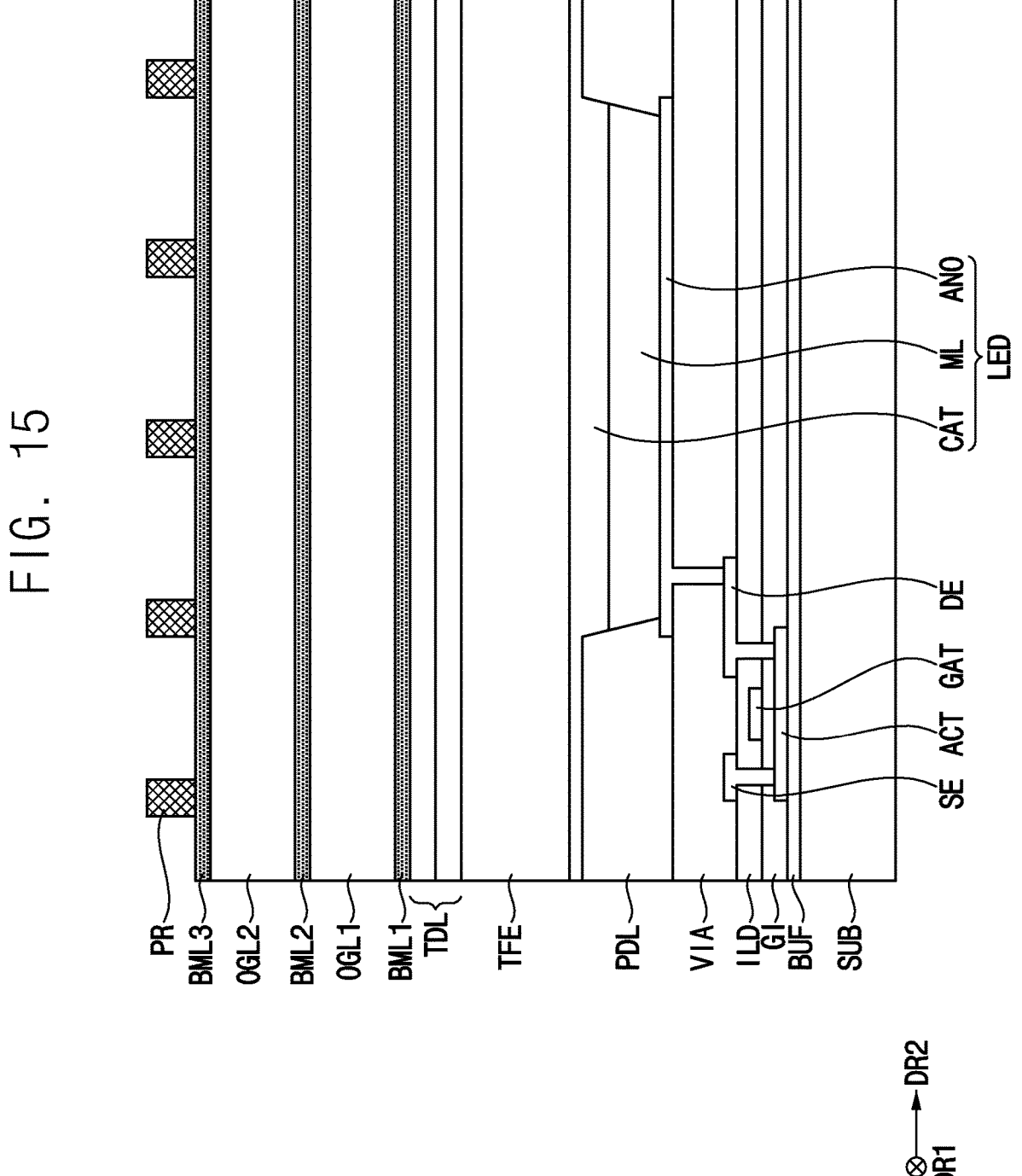

Referring to FIG. 15, a photoresist pattern PR may be formed on the third light blocking layer BML3. The photoresist pattern PR may be formed by exposing and developing a photoresist layer using a mask after forming the photoresist layer on the third light blocking layer BML3. The photoresist pattern PR may overlap the light emitting diode LED.

The photoresist patterns PR may be arranged parallel to each other in a plan view. The photoresist patterns PR may be parallel to each other. The photoresist pattern PR may extend in the first direction DR1. The photoresist patterns PR may be spaced apart from each other in the second direction DR2.

Figure 16:
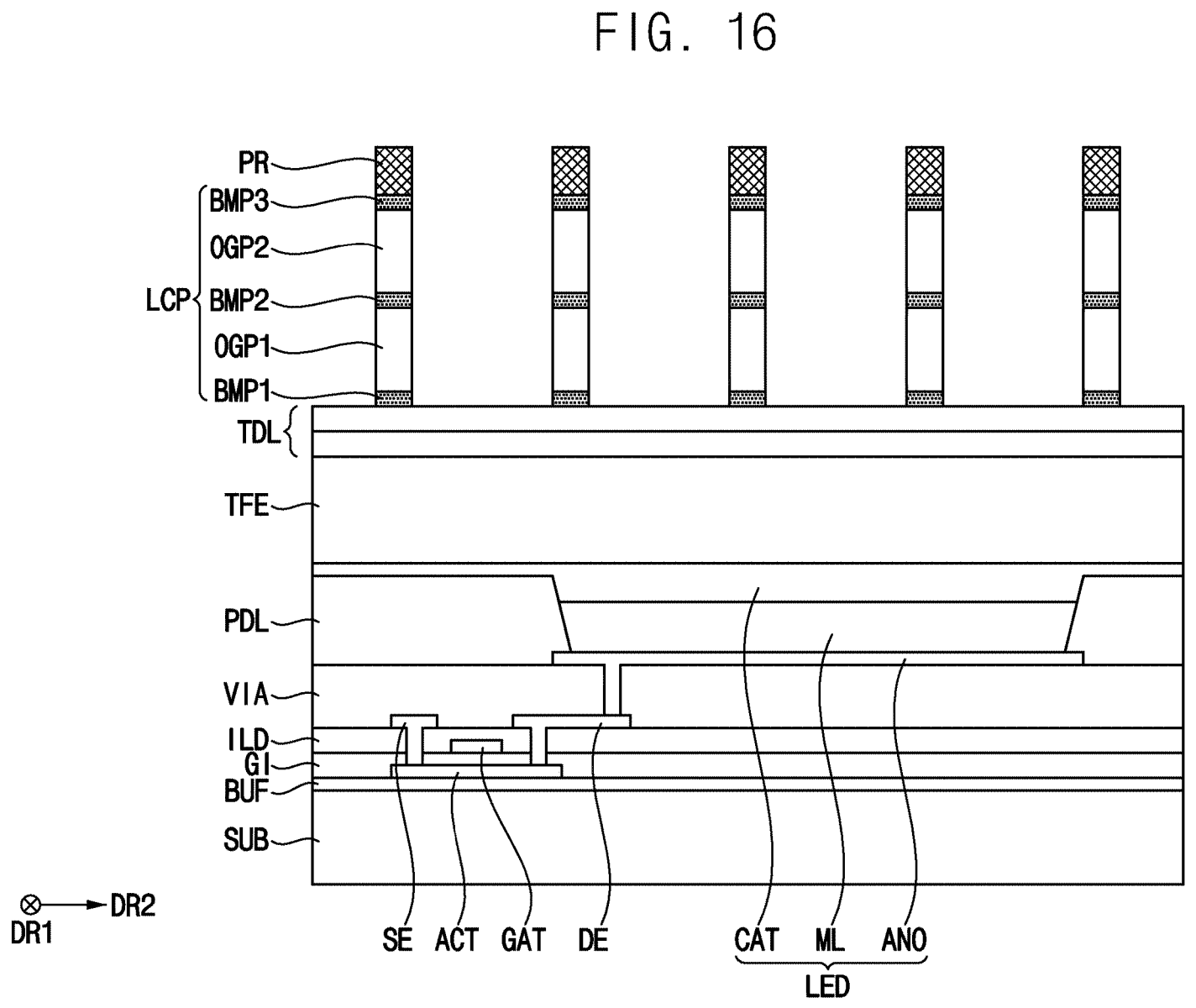

Referring to FIG. 16, light control patterns LCP may be formed by patterning the first to third light blocking layers BML1, BML2, and BML3 and the first and second organic layers OGL1 and OGL2 using the photoresist pattern PR as a mask.

In an embodiment, the third light-blocking layers BML3, the second organic layer OGL2, the second light-blocking layers BML2, the first second organic layer OGL2, and the first light-blocking layers BML1 may be sequentially patterned using the photoresist pattern PR as the mask.

The light control patterns LCP may be formed in a shape similar to a shape of the photoresist pattern PR. That is, the light control patterns LCP may be arranged side by side or parallel to each other in the plan view. Also, the light control patterns LCP may extend in the first direction DR1 and be spaced apart from each other in the second direction DR2.

The light control patterns LCP may be formed by a dry etching process. The light control patterns LCP may be formed by etching the first to third light blocking layers BML1 , BML2, and BML3 and the first and second organic layers OGL1 and OGL2 using a dry etching process.

Figure 17:
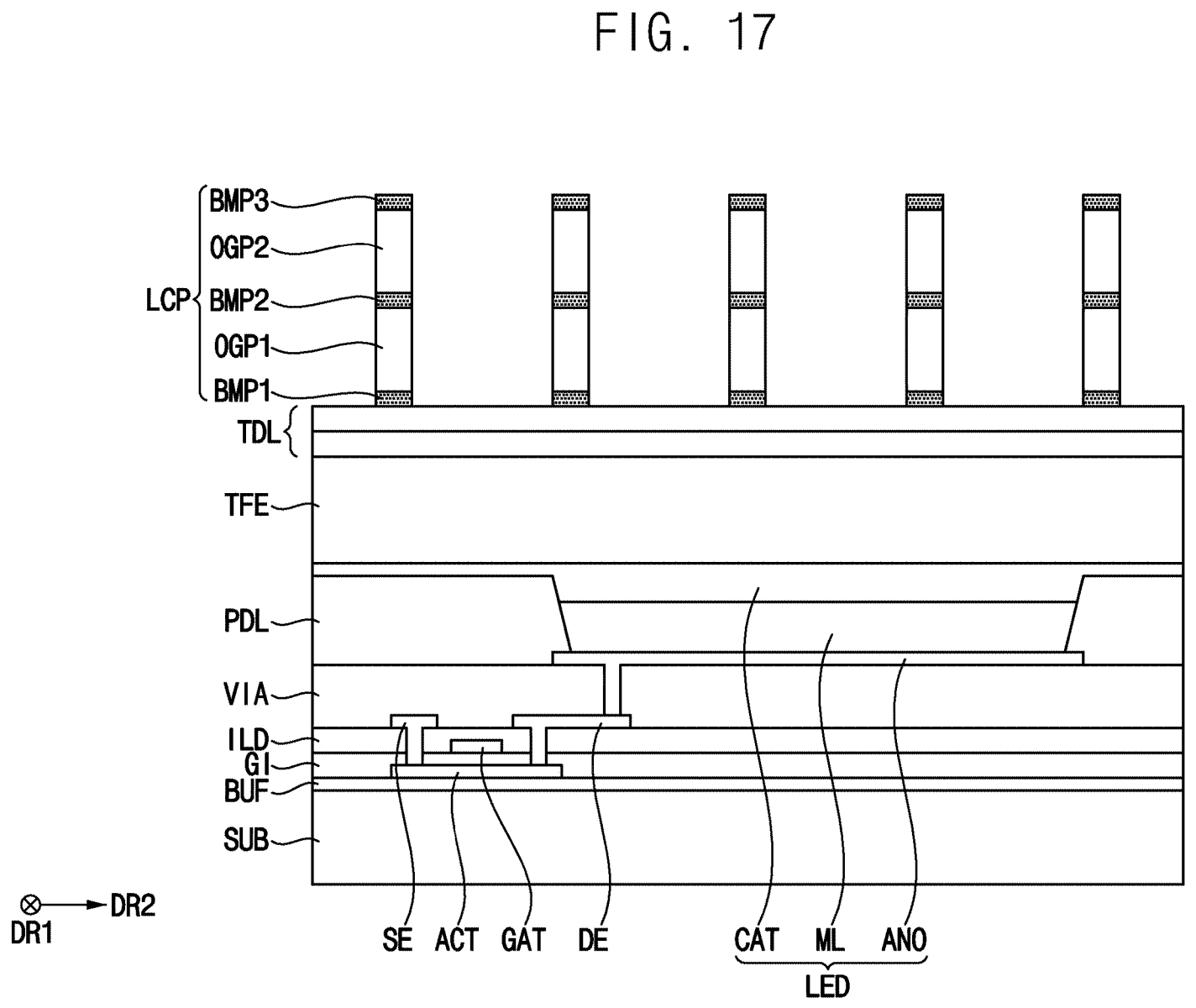

Referring to FIG. 17, the photoresist pattern PR may be removed after the light control patterns LCP are formed.

Hereinafter, the step of forming the light control patterns LCP will be described in detail with reference to FIGS. 18 to 23.

Figure 18:
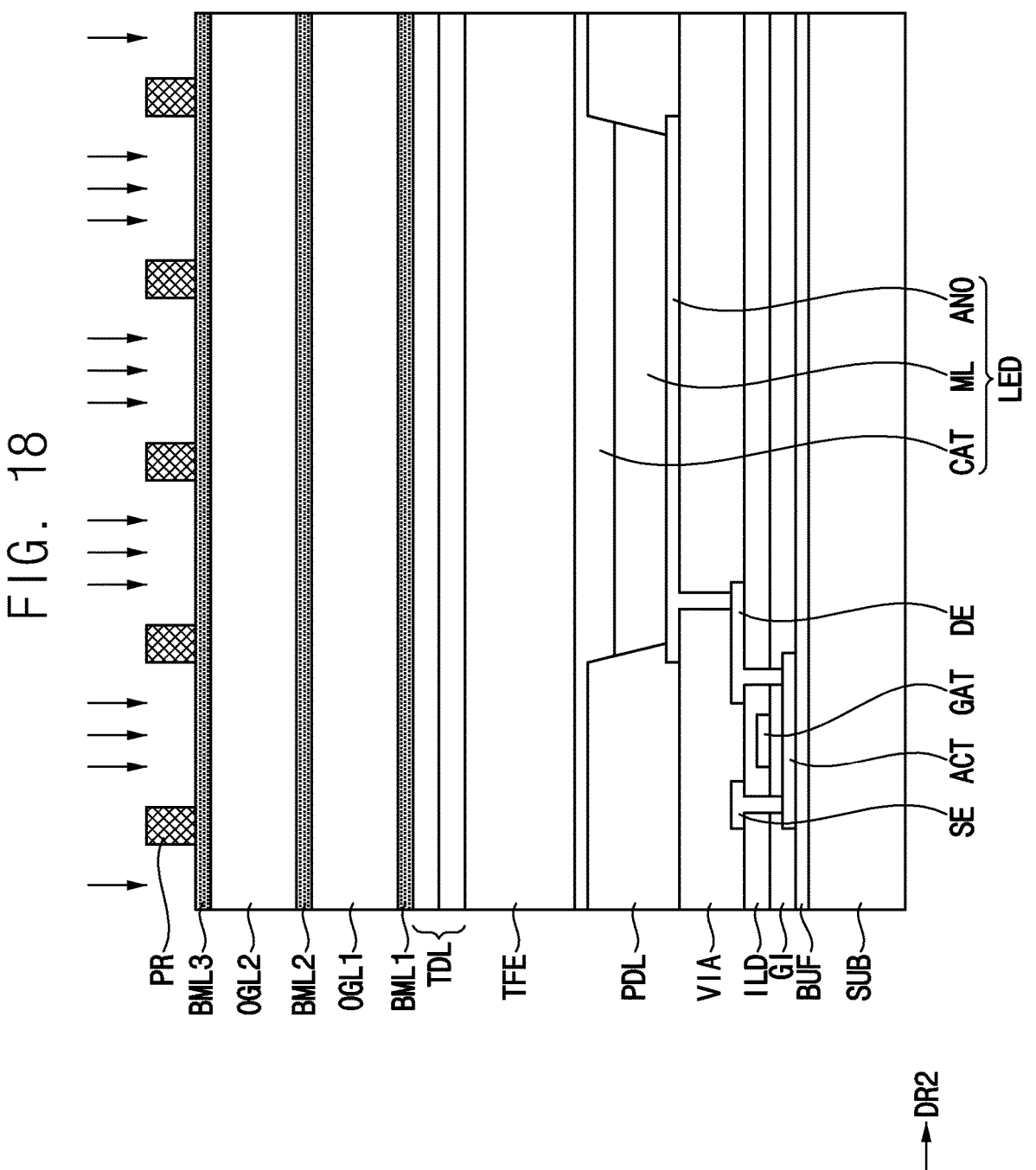

Referring to FIG. 18, third light blocking patterns BMP3 spaced apart from each other may be formed by patterning the third light blocking layer BML3. For example, the third light blocking layer BML3 may be etched using the photoresist pattern PR as a mask. Accordingly, the third light blocking patterns BMP3 overlapping the photoresist pattern PR may be formed.

Figure 19:
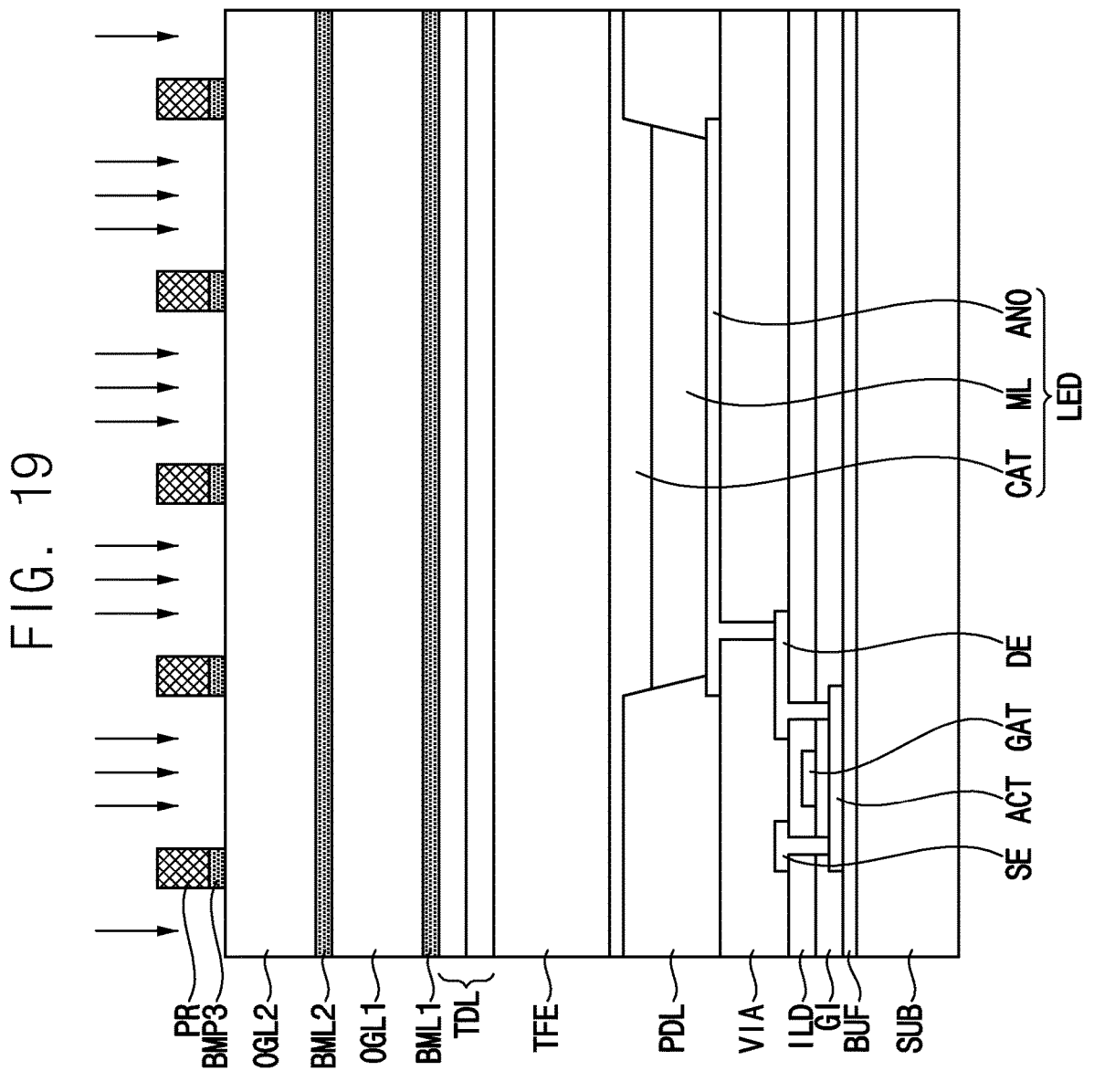

Referring to FIG. 19, second organic patterns OGP2 spaced apart from each other may be formed by patterning the second organic layer OGL2. For example, the second organic layer OGL2 may be etched using the photoresist pattern PR as a mask. Accordingly, the second organic patterns OGP2 overlapping the photoresist pattern PR may be formed.

Figure 20:
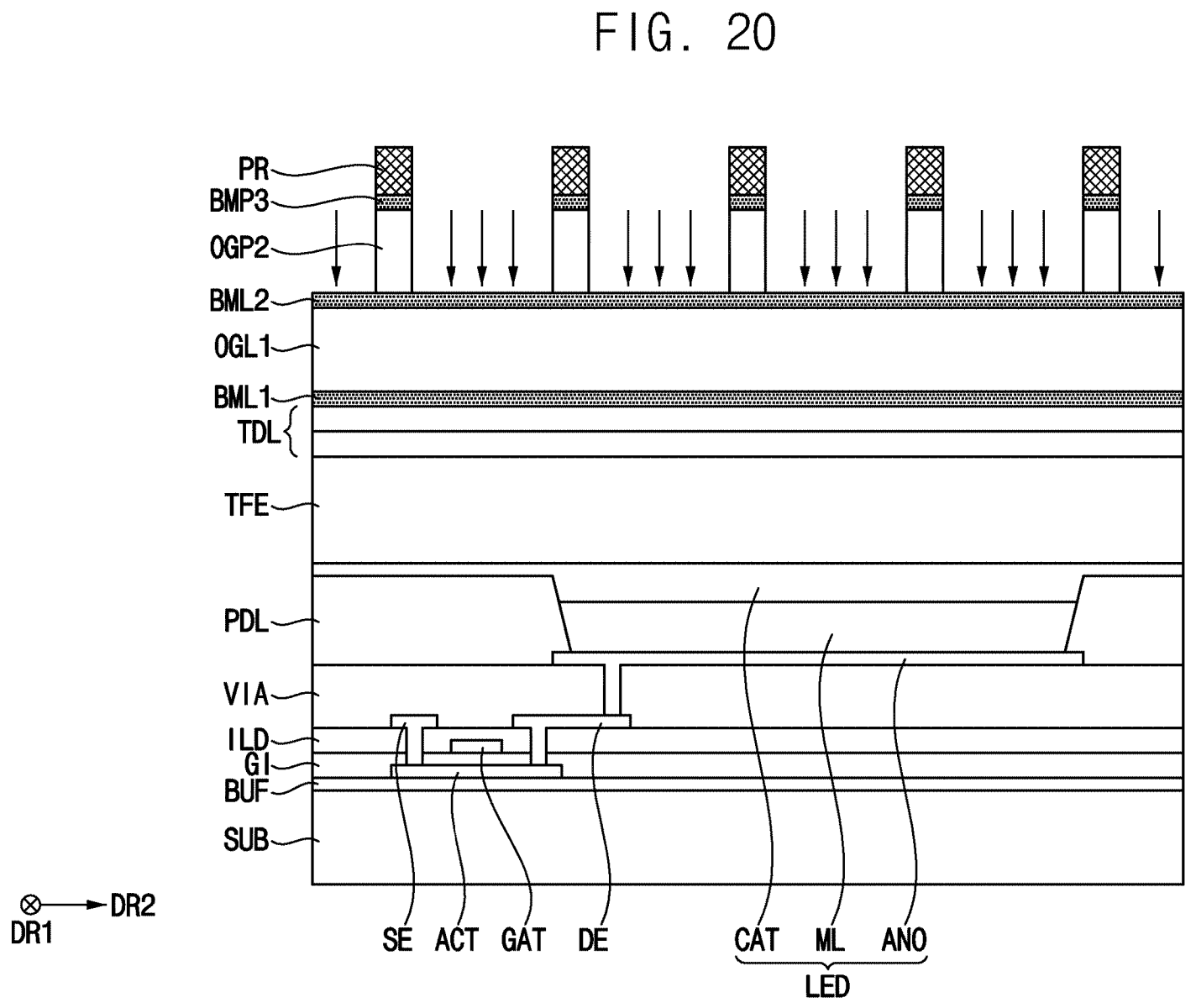

Referring to FIG. 20, second light blocking patterns BMP2 spaced apart from each other may be formed by patterning the second light blocking layer BML2. For example, the second light blocking layer BML2 may be etched using the photoresist pattern PR as a mask. Accordingly, the second light blocking patterns BMP2 overlapping the photoresist pattern PR may be formed.

Figure 21:
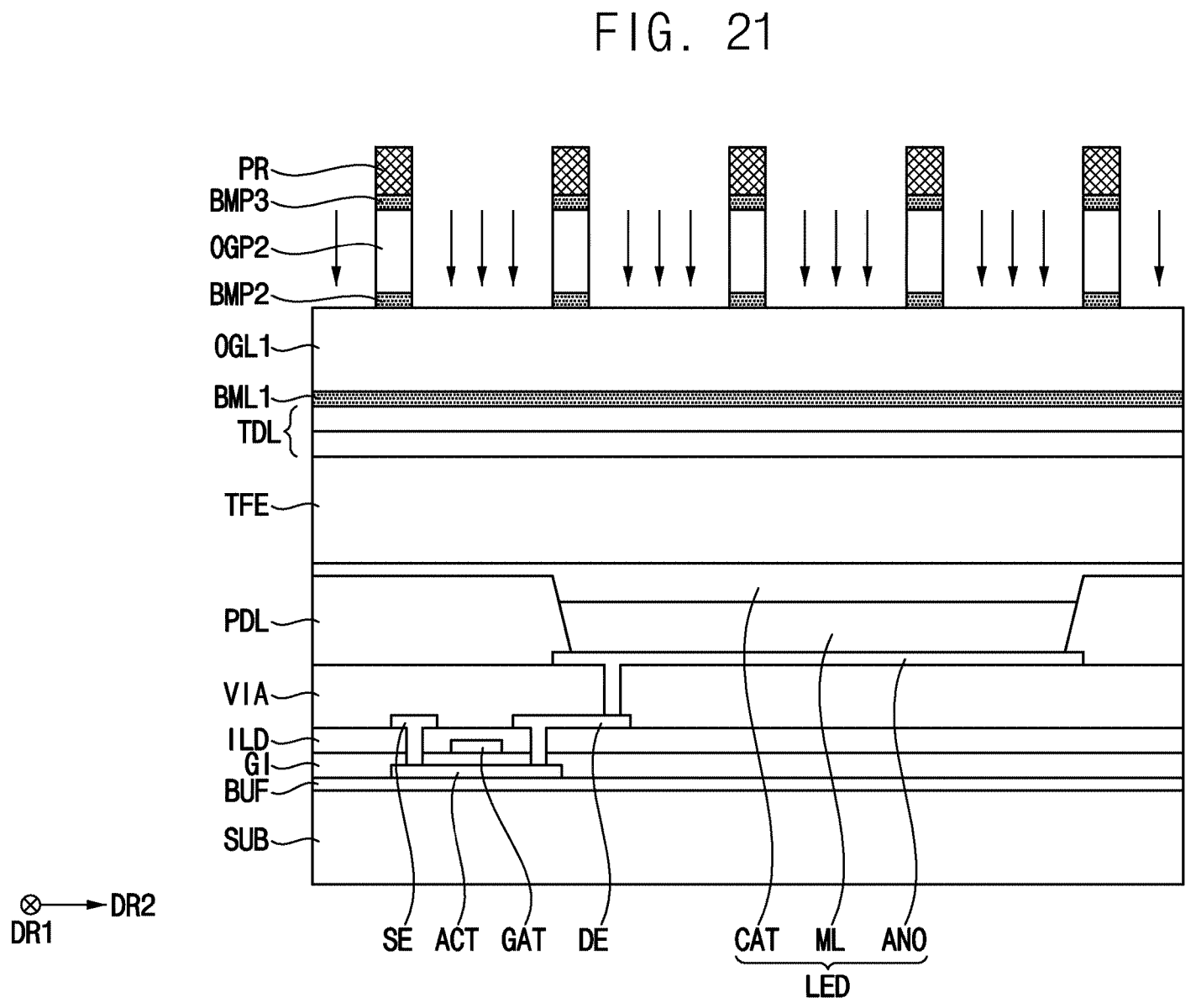

Referring to FIG. 21, first organic patterns OGP1 spaced apart from each other may be formed by patterning the first organic layer OGL1. For example, the first organic layer OGL1 may be etched using the photoresist pattern PR as a mask. Accordingly, the first organic patterns OGP1 overlapping the photoresist pattern PR may be formed.

Figure 22:
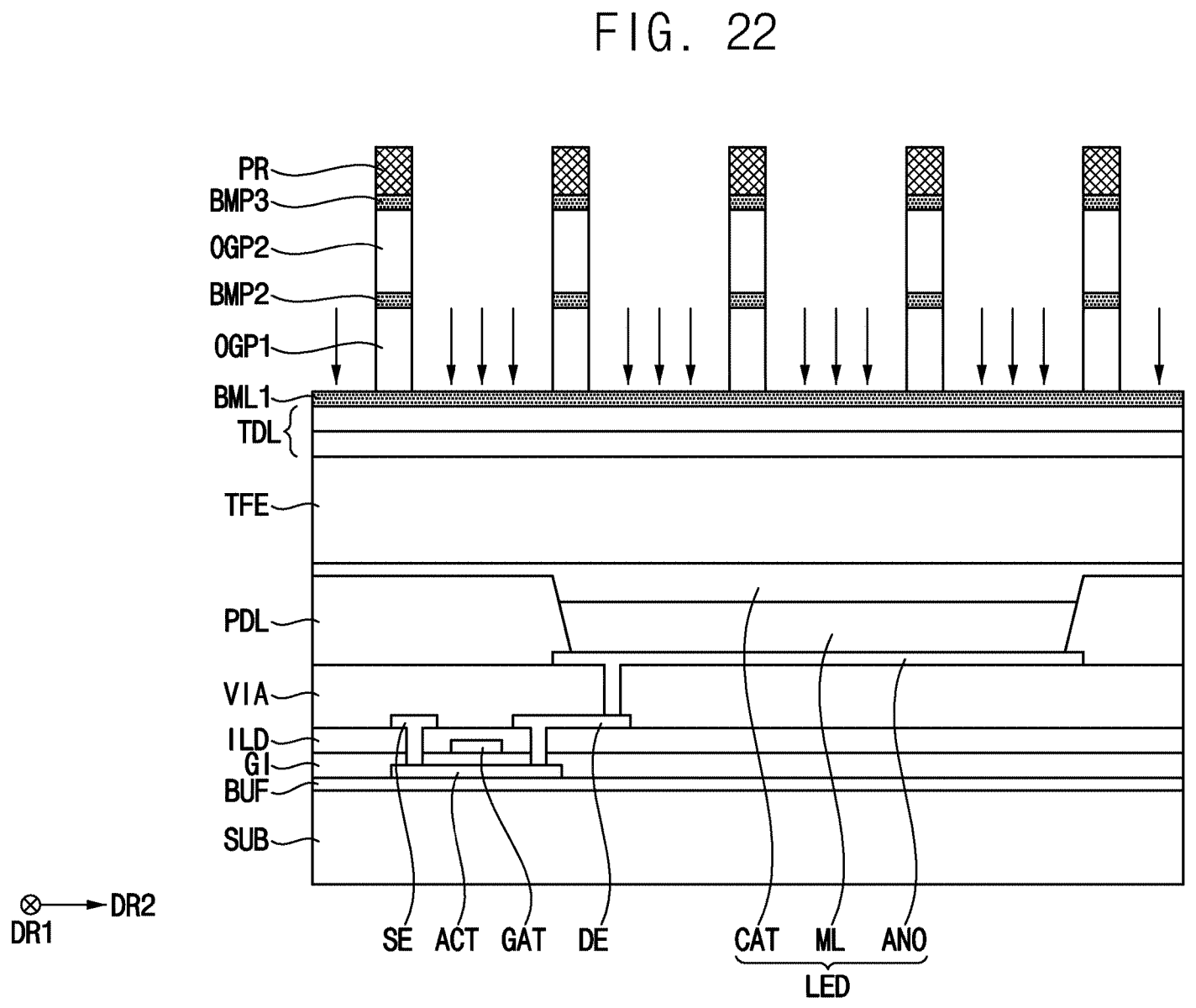

Referring to FIG. 22, first light-blocking patterns BMP1 spaced apart from each other may be formed by patterning the first light-blocking layer BML1. For example, the first light blocking layer BML1 may be etched using the photoresist pattern PR as a mask. Accordingly, the first light blocking patterns BMP1 overlapping the photoresist pattern PR may be formed.

Figure 23:
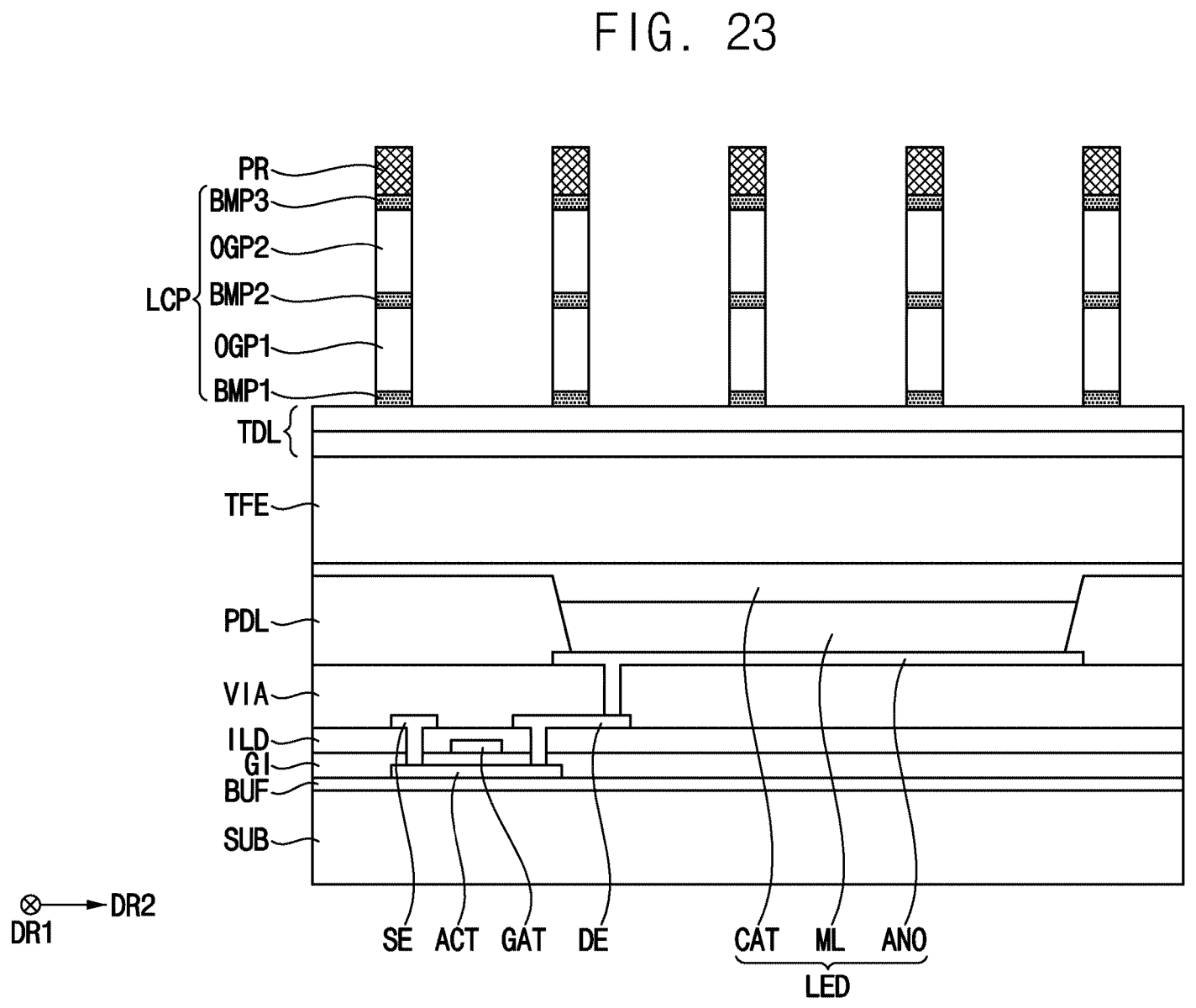

Referring to FIG. 23, each of the first blocking patterns BMP1, each of the first organic patterns OGP1, each of the second blocking patterns BMP2, and each of the second organic patterns OGP2 and each of the third blocking patterns BMP3 may overlap each other. The first light-blocking pattern BMP1, the first organic pattern OGP1, the second light-blocking pattern BMP2, the second organic pattern OGP2, and the third light-blocking pattern BMP3 overlapping each other may form the light control pattern LCP.

Referring to FIGS. 18 to 23, the forming of the first to third light blocking patterns BMP1, BMP2, and BMP3 and the forming of the first and second organic patterns OGP1 and OGP2 may be performed under different conditions. Therefore, by forming the first to third light blocking patterns BMP1, BMP2, and BMP3 and the first and second organic patterns OGP1 and OGP2 under different conditions, a side profile of each of the first to third light blocking patterns BMP1, BMP2, and BMP3 and the first and second organic patterns OGP1 and OGP2 may be adjusted according to conditions. In addition, process efficiency may be improved when the light control patterns LCP are formed.

Figure 24:
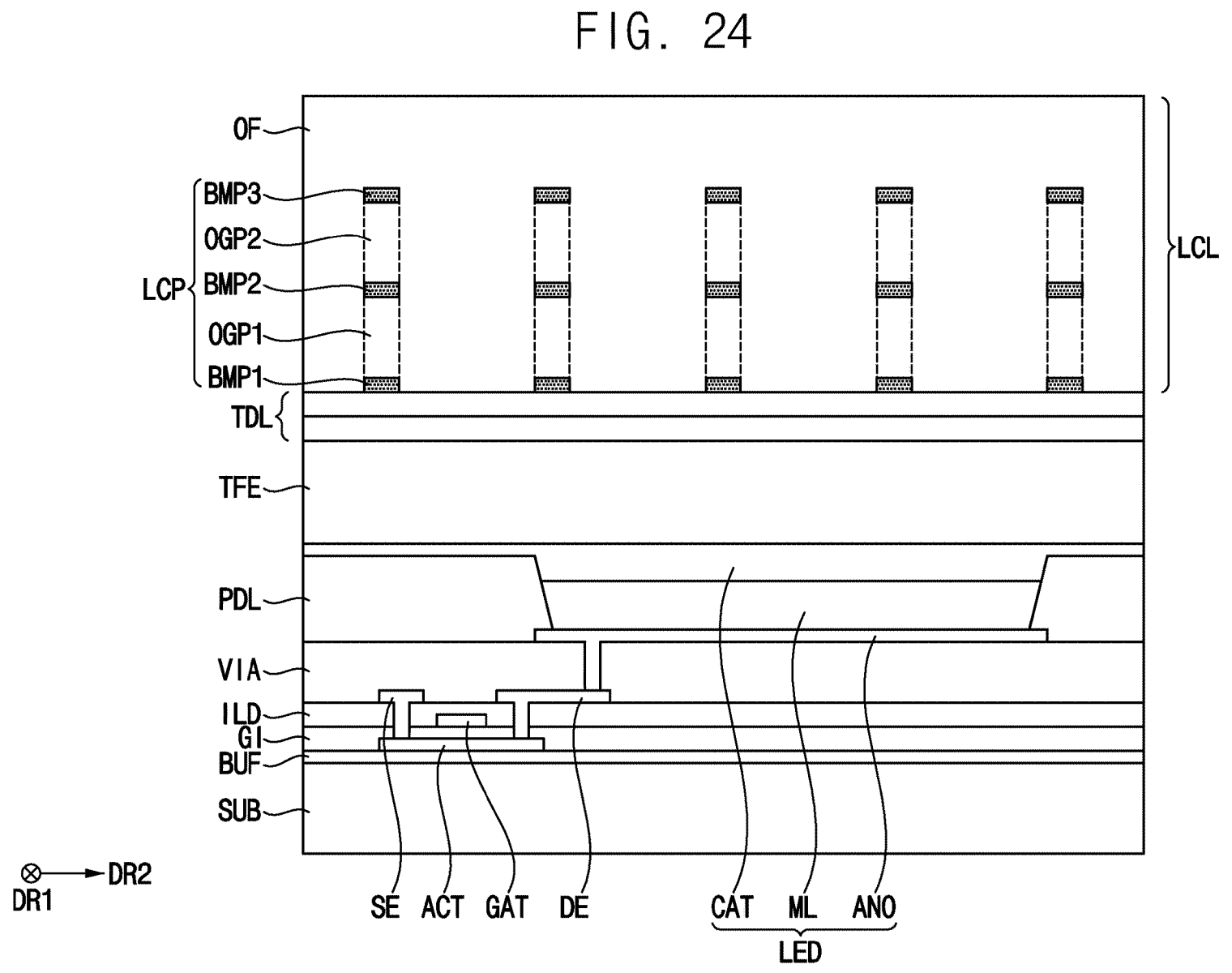

Referring to FIG. 24, after the light control patterns LCP are formed, an organic film OF may be formed on the touch sensing layer TDL. The organic film OF may be formed between adjacent light control patterns LCP among the light control patterns LCP. The light control patterns LCP and the organic film OF may form a light control layer LCL.

The organic film OF may be formed of the same material as the first and second organic layers OGL1 and OGL2 and may fill a space between the light control patterns LCP. The organic film OF may cover the light control patterns LCP. The organic film OF may cover side surfaces of the first and second organic patterns OGP1 and OGP2. Accordingly, the side surfaces and an upper surface of each of the first and second organic patterns OGP1 and OGP2 may be covered by the organic film OF. As a result, a dispersion of the side profile may be reduced and reliability of the display device may be improved.

In an embodiment, as the first to third light blocking layers BML1, BML2, and BML3 and the first and second organic layers OGL1 and OGL2 are formed on the light emitting diode LED, and patterning using the photoresist pattern PR as a mask, a difference in the side profile of each of the first and second organic patterns OGP1 and OGP2 may be reduced or the display device having the same structure may be formed regardless of the side profile of each of the first and second organic patterns OGP1 and OGP2. In addition, the size of an area through which the light emitted from the light emitting diode LED can pass may be maintained uniform. Accordingly, process efficiency may be improved while maintaining a uniform transmittance of the display device and reliability of the display device may be improved.

Figure 25:
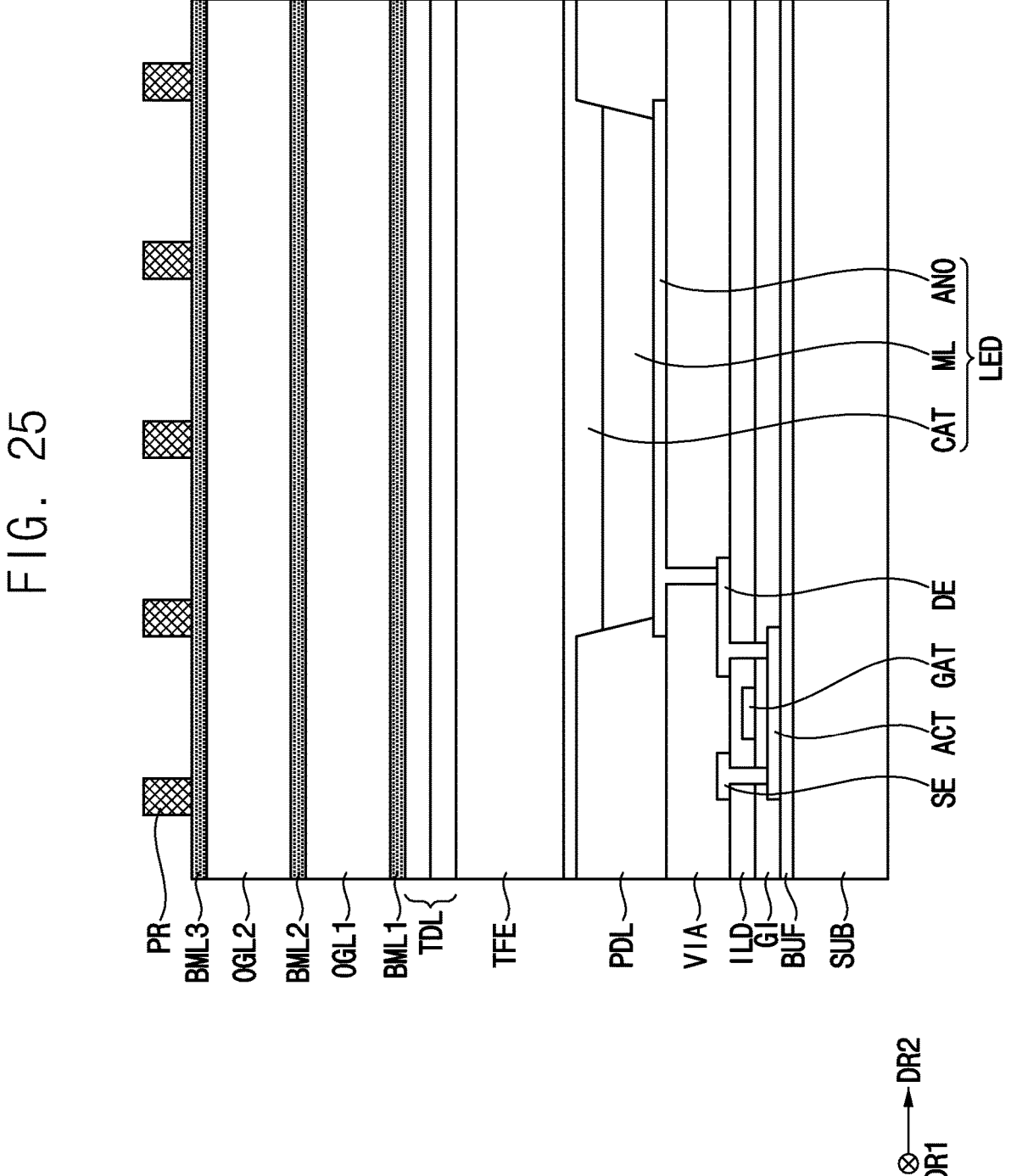
Figure 26:
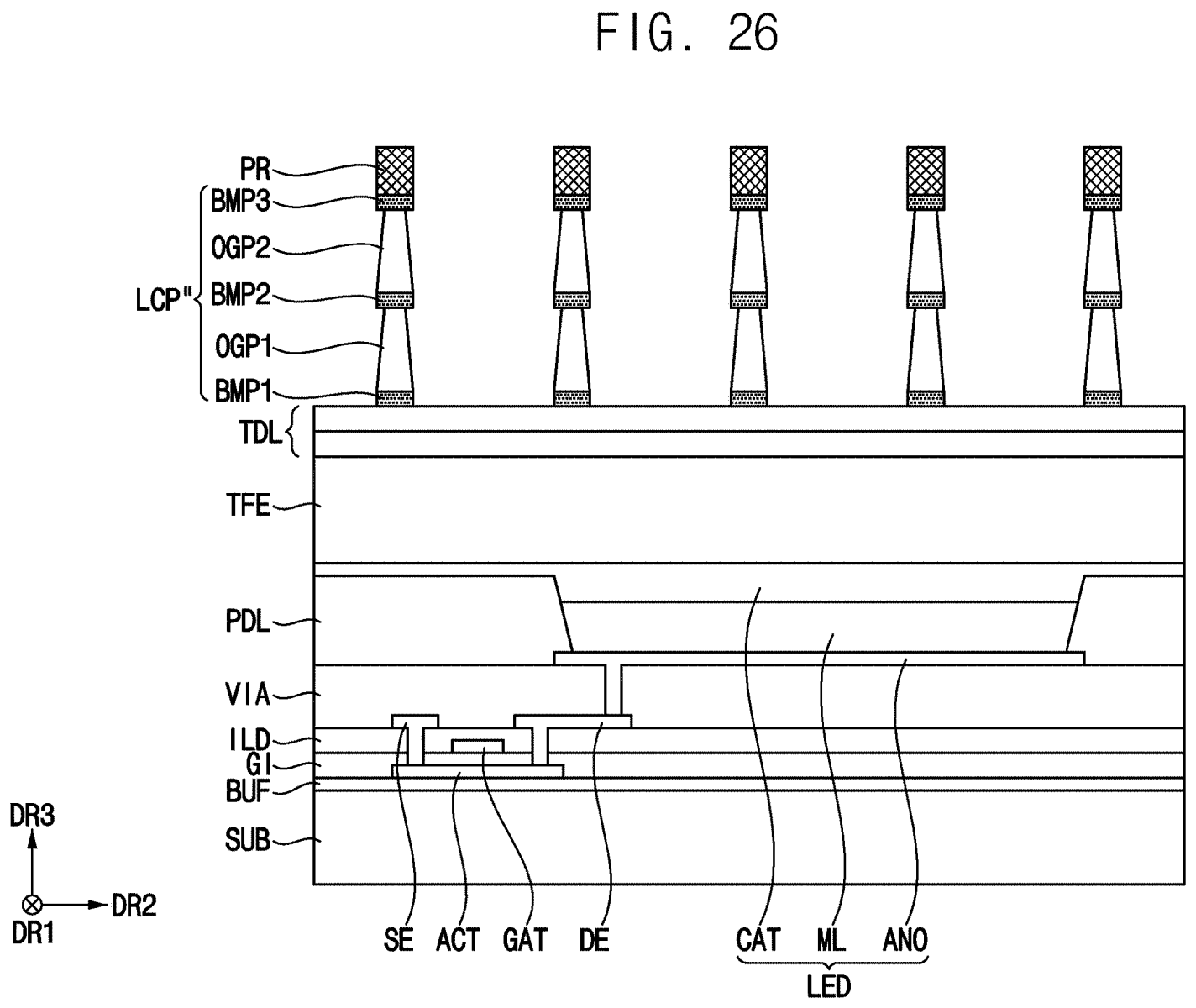
Figure 27:
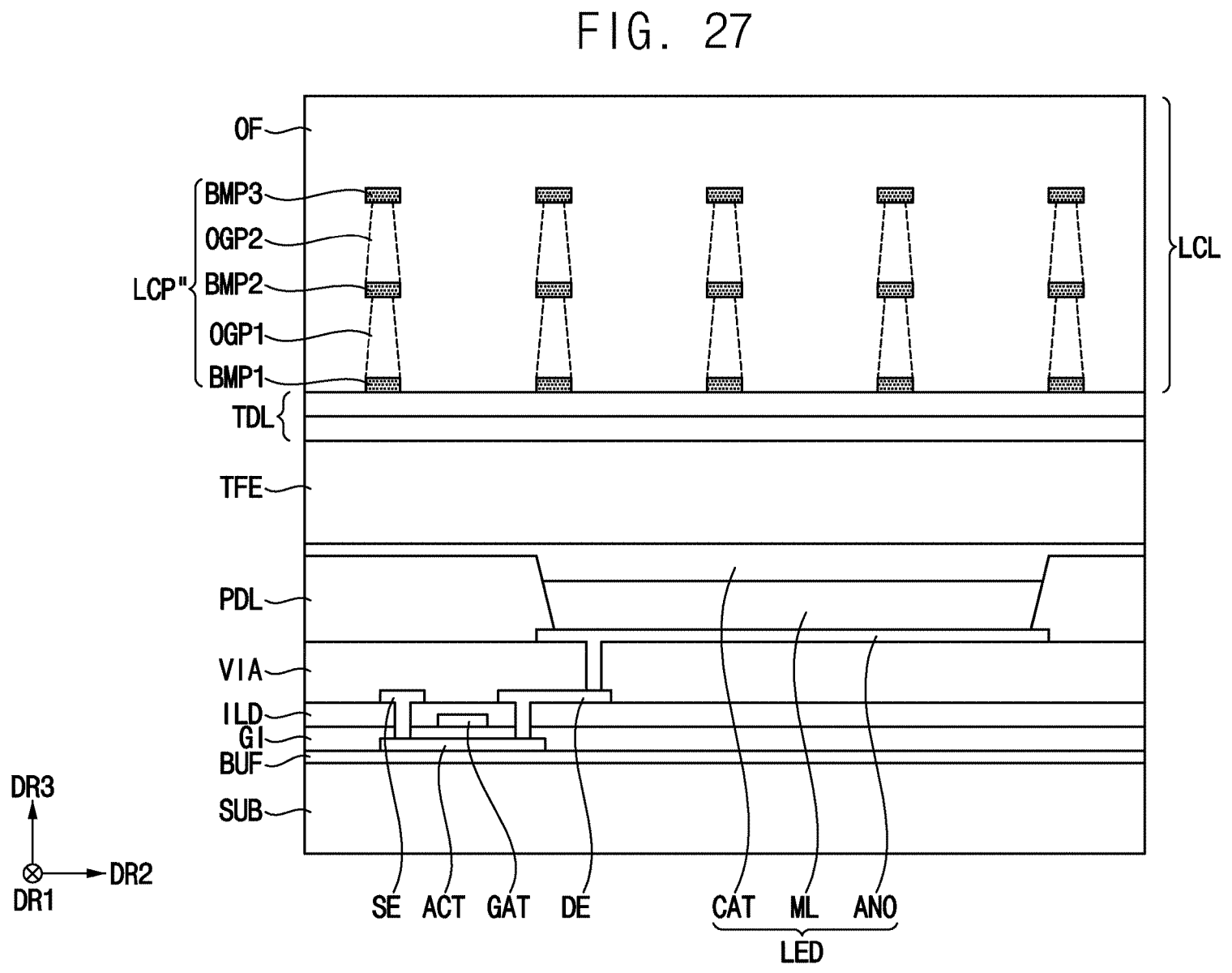

FIGS. 25 to 27 are cross-sectional views illustrating a manufacturing method of a display device according to another embodiment.

Among a method of manufacturing a display device described with reference to FIGS. 25 to 27, the same parts as the method of manufacturing the display device described with reference to FIGS. 9 to 24 may be omitted.

Referring to FIGS. 25 to 27, a photoresist pattern PR may be formed on the third light blocking layers BML3.

In an embodiment, light control patterns LCP'' may be formed by patterning the first to third light-blocking layers BML1, BML2, and BML3 and the first and second organic layers OGL1 and OGL2 using the photoresist pattern PR as a mask. The first to third light blocking patterns BMP1, BMP2, and BMP3 and the first and second organic patterns OGP1 and OGP2 may form the light control patterns LCP''

A side profile of each of the first and second organic patterns OGP1 and OGP2 may be formed to have a undercut portions. That is, a side surface of the each of the first and second organic patterns OGP1 and OGP2 may be inclined with respect to a third direction DR3. The third direction DR3 may cross the first direction DR1 and the second direction DR2.

After the light control patterns LCP'' are formed, an organic film OF may be formed. The organic film OF may be formed of the same material as the first and second organic layers OGL1 and OGL2 and may fill a space between the light control patterns LCP''.

In an embodiment, the organic film OF may cover side surfaces of the first and second organic patterns OGP1 and OGP2. Accordingly, the side profile of each of the first and second organic patterns OGP1 and OGP2 may be covered. Accordingly, even when the side profile of each of the first and second organic patterns OGP1 and OGP2 are formed differently, the same light control layer LCL may be formed. Accordingly, reliability of the display device may be improved.

The display devices and the methods according to the embodiments may be applied to a display device included in a computer, a notebook, a mobile phone, a smartphone, a smart pad, a PMP, a PDA, an MP3 player, or the like.

Although the display devices and the methods according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a substrate;
a light emitting diode disposed on the substrate; and
light control patterns overlapping the light emitting diode, the light control patterns including at least three light blocking patterns and at least two organic patterns alternately disposed on the light emitting diode and spaced apart from each other.

2. The display device of claim 1, further comprising:
an organic film disposed on the light emitting diode and disposed between adjacent light control patterns.

3. The display device of claim 2, wherein the organic film contacts the at least two organic patterns and includes the same material as the at least two organic patterns.

4. The display device of claim 2, wherein the organic film covers upper surfaces of the light control patterns.

5. The display device of claim 1, wherein the light blocking patterns and the at least two organic patterns included in one of the light control patterns overlap each other.

6. The display device of claim 1, wherein the light control pattern includes,
a first light blocking pattern disposed on the light emitting diode;
a first organic pattern disposed on the first light blocking pattern;
a second light blocking pattern disposed on the first organic pattern;
a second organic pattern disposed on the second light blocking pattern; and
a third light blocking pattern disposed on the second organic pattern.

7. The display device of claim 6, wherein a thickness of the first organic pattern and a thickness of the second organic pattern are equal to each other.

8. The display device of claim 6, wherein a thickness of the first organic pattern and a thickness of the second organic pattern are different from each other.

9. The display device of claim 1, wherein the light blocking patterns include a conductive material, a black pigment, or a black dye.

10. The display device of claim 1, wherein the light blocking patterns include molybdenum-tantalum oxide (MTO).

11. The display device of claim 1, wherein each of the light blocking patterns has a multilayer structure.

12. The display device of claim 11, wherein the multilayer structure is at least one selected from the group consisting of MTO/Mo, MTO/Ti, MTO/Al, MTO/Mo/MTO, MTO/Ti/MTO, and MTO/Al/MTO.

* * * * *